United States Patent
Wober et al.

(10) Patent No.: US 9,304,035 B2
(45) Date of Patent: *Apr. 5, 2016

(54) VERTICAL WAVEGUIDES WITH VARIOUS FUNCTIONALITY ON INTEGRATED CIRCUITS

(71) Applicant: ZENA TECHNOLOGIES, INC., Cambridge, MA (US)

(72) Inventors: Munib Wober, Topsfield, MA (US); Thomas P. F. H. Wendling, Munich (DE)

(73) Assignee: ZENA TECHNOLOGIES, INC., Cambridge, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/925,429

(22) Filed: Jun. 24, 2013

(65) Prior Publication Data

US 2013/0277538 A1    Oct. 24, 2013

Related U.S. Application Data

(63) Continuation of application No. 12/270,233, filed on Nov. 13, 2008, now Pat. No. 8,274,039.

(51) Int. Cl.
  *G01J 1/04*  (2006.01)
  *B82Y 20/00* (2011.01)
  (Continued)

(52) U.S. Cl.
  CPC .............. *G01J 1/0425* (2013.01); *B82Y 20/00* (2013.01); *G02B 6/107* (2013.01);
  (Continued)

(58) Field of Classification Search
  CPC . Y10S 977/742; Y10S 977/743; Y10S 70/51; Y10S 116/05; H01L 21/02603; H01L 21/02606; H01L 51/0048; H01L 29/0669

USPC ......... 250/208.1, 208.2, 216, 227.23, 227.22; 385/14, 49, 88, 89, 92, 93, 123, 385/126–128, 129–132; 398/79
  See application file for complete search history.

(56) References Cited

U.S. PATENT DOCUMENTS

| 1,918,848 A | 7/1933 | Land |
| 3,903,427 A | 9/1975 | Pack |

(Continued)

FOREIGN PATENT DOCUMENTS

| CN | 1624925 | 6/2005 |
| CN | 1306619 | 3/2007 |

(Continued)

OTHER PUBLICATIONS

Bernstein et al. "Modern Physics", Chapter 14, Section 6, pp. 420-421. 2000 by Prentice-Hall Inc.*

(Continued)

*Primary Examiner* — Francis M Legasse, Jr.
(74) *Attorney, Agent, or Firm* — Pillsbury Winthrop Shaw Pittman LLP

(57) ABSTRACT

An embodiment relates to a device comprising an optical pipe comprising a core and a cladding, the optical pipe being configured to separate wavelengths of an electromagnetic radiation beam incident on the optical pipe at a selective wavelength through the core and the cladding, wherein the core is configured to be both a channel to transmit the wavelengths up to the selective wavelength and an active element to detect the wavelengths up to the selective wavelength transmitted through the core. Other embodiments relate to a compound light detector.

54 Claims, 24 Drawing Sheets

(51) Int. Cl.
   *G02B 6/10*      (2006.01)
   *G02B 6/12*      (2006.01)
   *G02B 6/42*      (2006.01)
   *H01L 49/02*     (2006.01)
   *H01L 21/02*     (2006.01)
   *H01L 27/146*    (2006.01)

(52) U.S. Cl.
   CPC ............. *G02B 6/12004* (2013.01); *G02B 6/42* (2013.01); *H01L 27/14627* (2013.01); *H01L 27/14629* (2013.01); *H01L 27/14632* (2013.01); *H01L 27/14685* (2013.01); *H01L 27/14687* (2013.01); *H01L 28/60* (2013.01); *H01L 21/02532* (2013.01); *H01L 21/02573* (2013.01); *H01L 21/02653* (2013.01); *H01L 27/14621* (2013.01)

(56) References Cited

U.S. PATENT DOCUMENTS

| | | |
|---|---|---|
| 4,017,332 A | 4/1977 | James |
| 4,292,512 A | 9/1981 | Miller |
| 4,316,048 A | 2/1982 | Woodall |
| 4,357,415 A | 11/1982 | Hartman |
| 4,387,265 A | 6/1983 | Dalal |
| 4,394,571 A | 7/1983 | Jurisson |
| 4,400,221 A | 8/1983 | Rahilly |
| 4,443,890 A | 4/1984 | Eumurian |
| 4,513,168 A | 4/1985 | Borden |
| 4,531,055 A | 7/1985 | Shepherd, Jr. |
| 4,620,237 A | 10/1986 | Traino |
| 4,678,772 A | 7/1987 | Segal et al. |
| 4,827,335 A | 5/1989 | Saito |
| 4,846,556 A | 7/1989 | Haneda |
| 4,857,973 A | 8/1989 | Yang |
| 4,876,586 A | 10/1989 | Dyck |
| 4,880,613 A | 11/1989 | Satoh |
| 4,896,941 A | 1/1990 | Hayashi |
| 4,950,625 A | 8/1990 | Nakashima |
| 4,971,928 A | 11/1990 | Fuller |
| 4,972,244 A | 11/1990 | Buffet |
| 4,990,988 A | 2/1991 | Lin |
| 5,071,490 A | 12/1991 | Yokota |
| 5,081,049 A | 1/1992 | Green |
| 5,096,520 A | 3/1992 | Faris |
| 5,124,543 A | 6/1992 | Kawashima |
| 5,217,911 A | 6/1993 | Denda |
| 5,247,349 A | 9/1993 | Olego |
| 5,272,518 A | 12/1993 | Vincent |
| 5,311,047 A | 5/1994 | Chang |
| 5,347,147 A | 9/1994 | Jones |
| 5,362,972 A | 11/1994 | Yazawa |
| 5,374,841 A | 12/1994 | Goodwin |
| 5,391,896 A | 2/1995 | Wanlass |
| 5,401,968 A | 3/1995 | Cox |
| 5,449,626 A | 9/1995 | Hezel |
| 5,468,652 A | 11/1995 | Gee |
| 5,602,661 A | 2/1997 | Schadt |
| 5,612,780 A | 3/1997 | Rickenbach |
| 5,671,914 A | 9/1997 | Kalkhoran |
| 5,696,863 A | 12/1997 | Kleinerman |
| 5,723,945 A | 3/1998 | Schermerhorn |
| 5,747,796 A | 5/1998 | Heard |
| 5,767,507 A | 6/1998 | Unul |
| 5,798,535 A | 8/1998 | Huang |
| 5,844,290 A | 12/1998 | Furumiya |
| 5,853,446 A | 12/1998 | Carre |
| 5,857,053 A | 1/1999 | Kane |
| 5,877,492 A | 3/1999 | Fujieda |
| 5,880,495 A | 3/1999 | Chen |
| 5,885,881 A | 3/1999 | Ojha |
| 5,900,623 A | 5/1999 | Tsang |
| 5,943,463 A | 8/1999 | Unuma |
| 5,968,528 A | 10/1999 | Deckner et al. |
| 6,013,871 A | 1/2000 | Curtin |
| 6,033,582 A | 3/2000 | Lee |
| 6,037,243 A | 3/2000 | Ha |
| 6,046,466 A | 4/2000 | Ishida |
| 6,074,892 A | 6/2000 | Bowers |
| 6,100,551 A | 8/2000 | Lee |
| 6,270,548 B1 | 8/2001 | Campbell |
| 6,301,420 B1 | 10/2001 | Greenaway |
| 6,326,649 B1 | 12/2001 | Chang |
| 6,388,243 B1 | 5/2002 | Berezin |
| 6,388,648 B1 | 5/2002 | Clifton |
| 6,407,439 B1 | 6/2002 | Hier |
| 6,459,034 B2 | 10/2002 | Muramoto |
| 6,463,204 B1 | 10/2002 | Ati |
| 6,542,231 B1 | 4/2003 | Garrett |
| 6,563,995 B2 | 5/2003 | Keaton |
| 6,566,723 B1 | 5/2003 | Vook |
| 6,680,216 B2 | 1/2004 | Kwasnick |
| 6,709,929 B2 | 3/2004 | Zhang |
| 6,720,594 B2 | 4/2004 | Rahn |
| 6,771,314 B1 | 8/2004 | Bawolek |
| 6,805,139 B1 | 10/2004 | Savas |
| 6,812,473 B1 | 11/2004 | Amemiya |
| 6,904,187 B2 | 6/2005 | Fischer et al. |
| 6,927,145 B1 | 8/2005 | Yang |
| 6,960,526 B1 | 11/2005 | Shah |
| 6,967,120 B2 | 11/2005 | Jang |
| 6,969,899 B2 | 11/2005 | Yaung |
| 6,987,258 B2 | 1/2006 | Mates |
| 6,996,147 B2 | 2/2006 | Majumdar |
| 7,052,927 B1 | 5/2006 | Fletcher |
| 7,064,372 B2 | 6/2006 | Duan |
| 7,105,428 B2 | 9/2006 | Pan |
| 7,106,938 B2 | 9/2006 | Baek et al. |
| 7,109,517 B2 | 9/2006 | Zaidi |
| 7,153,720 B2 | 12/2006 | Augusto |
| 7,163,659 B2 | 1/2007 | Stasiak |
| 7,192,533 B2 | 3/2007 | Bakkers |
| 7,208,783 B2 | 4/2007 | Palsule |
| 7,230,286 B2 | 6/2007 | Cohen |
| 7,235,475 B2 | 6/2007 | Kamins |
| 7,241,434 B2 | 7/2007 | Anthony |
| 7,253,017 B1 | 8/2007 | Roscheisen |
| 7,254,151 B2 | 8/2007 | Lieber |
| 7,262,400 B2 | 8/2007 | Yaung |
| 7,265,328 B2 | 9/2007 | Mouli |
| 7,272,287 B2 | 9/2007 | Bise |
| 7,285,812 B2 | 10/2007 | Tang |
| 7,306,963 B2 | 12/2007 | Linden |
| 7,307,327 B2 | 12/2007 | Bahl |
| 7,311,889 B2 | 12/2007 | Awano |
| 7,326,915 B2 | 2/2008 | Kaluzhny |
| 7,330,404 B2 | 2/2008 | Peng |
| 7,335,962 B2 | 2/2008 | Mouli |
| 7,336,860 B2 | 2/2008 | Cyr |
| 7,339,110 B1 | 3/2008 | Mulligan et al. |
| 7,358,583 B2 | 4/2008 | Reznik |
| 7,381,966 B2 | 6/2008 | Starikov |
| 7,388,147 B2 | 6/2008 | Mulligan |
| 7,416,911 B2 | 8/2008 | Heath et al. |
| 7,446,025 B2 | 11/2008 | Cohen |
| 7,462,774 B2 | 12/2008 | Roscheisen |
| 7,471,428 B2 | 12/2008 | Ohara |
| 7,491,269 B2 | 2/2009 | Legagneux |
| 7,507,293 B2 | 3/2009 | Li |
| 7,521,322 B2 | 4/2009 | Tang |
| 7,524,694 B2 | 4/2009 | Adkisson |
| 7,582,857 B2 | 9/2009 | Gruev |
| 7,598,482 B1 | 10/2009 | Verhulst |
| 7,622,367 B1 | 11/2009 | Nuzzo |
| 7,626,685 B2 | 12/2009 | Jin |
| 7,646,138 B2 | 1/2010 | Williams |
| 7,646,943 B1 | 1/2010 | Wober |
| 7,647,695 B2 | 1/2010 | MacNutt |
| 7,649,665 B2 | 1/2010 | Kempa et al. |
| 7,655,860 B2 | 2/2010 | Parsons |
| 7,663,202 B2 | 2/2010 | Wang |
| 7,692,860 B2 | 4/2010 | Sato et al. |
| 7,704,806 B2 | 4/2010 | Chae |

(56) References Cited

U.S. PATENT DOCUMENTS

| | | | |
|---|---|---|---|
| 7,713,779 B2 | 5/2010 | Firon | |
| 7,719,678 B2 | 5/2010 | Kamins | |
| 7,719,688 B2 | 5/2010 | Kamins | |
| 7,732,769 B2 | 6/2010 | Snider | |
| 7,732,839 B2 | 6/2010 | Sebe | |
| 7,736,954 B2 | 6/2010 | Hussain | |
| 7,740,824 B2 | 6/2010 | Godfried | |
| 7,790,495 B2 | 9/2010 | Assefa | |
| 7,888,155 B2 | 2/2011 | Chen | |
| 7,902,540 B2 | 3/2011 | Cohen | |
| 7,948,555 B2 | 5/2011 | Kwon et al. | |
| 8,030,729 B2 | 10/2011 | Quitoriano | |
| 8,035,184 B1 | 10/2011 | Dutta | |
| 8,049,203 B2 | 11/2011 | Samuelson | |
| 8,063,450 B2 | 11/2011 | Wernersson | |
| 8,067,299 B2 | 11/2011 | Samuelson | |
| 8,067,736 B2 | 11/2011 | Gruss | |
| 8,084,728 B2 | 12/2011 | Tsang | |
| 8,093,675 B2 | 1/2012 | Tsunemi | |
| 8,118,170 B2 | 2/2012 | Sato | |
| 8,143,658 B2 | 3/2012 | Samuelson | |
| 8,154,127 B1 | 4/2012 | Kamins | |
| 8,193,524 B2 | 6/2012 | Bjoerk | |
| 8,208,776 B2 | 6/2012 | Tokushima | |
| 8,212,138 B2 | 7/2012 | Landis | |
| 8,222,705 B2 | 7/2012 | Ogino | |
| 8,242,353 B2 | 8/2012 | Karg | |
| 8,269,985 B2 | 9/2012 | Wober | |
| 8,274,039 B2 * | 9/2012 | Wober et al. | 250/227.14 |
| 8,299,472 B2 | 10/2012 | Yu et al. | |
| 8,330,090 B2 | 12/2012 | Agarwal | |
| 8,384,007 B2 | 2/2013 | Yu et al. | |
| 8,455,857 B2 | 6/2013 | Samuelson | |
| 8,471,190 B2 | 6/2013 | Wober | |
| 8,514,411 B2 | 8/2013 | Wober | |
| 8,546,742 B2 | 10/2013 | Wober | |
| 8,748,799 B2 | 6/2014 | Wober | |
| 8,766,272 B2 | 7/2014 | Yu et al. | |
| 8,791,470 B2 | 7/2014 | Wober | |
| 8,810,808 B2 | 8/2014 | Wober | |
| 8,835,831 B2 | 9/2014 | Yu et al. | |
| 8,866,065 B2 | 10/2014 | Wober | |
| 9,000,353 B2 | 4/2015 | Seo | |
| 2002/0003201 A1 | 1/2002 | Yu | |
| 2002/0020846 A1 | 2/2002 | Pi | |
| 2002/0021879 A1 | 2/2002 | Lee | |
| 2002/0071468 A1 | 6/2002 | Sandstrom | |
| 2002/0104821 A1 | 8/2002 | Bazylenko | |
| 2002/0109082 A1 | 8/2002 | Nakayama | |
| 2002/0117675 A1 | 8/2002 | Mascarenhas | |
| 2002/0130311 A1 | 9/2002 | Lieber | |
| 2002/0172820 A1 | 11/2002 | Majumdar | |
| 2003/0003300 A1 | 1/2003 | Korgel | |
| 2003/0006363 A1 | 1/2003 | Campbell | |
| 2003/0077907 A1 | 4/2003 | Kao | |
| 2003/0089899 A1 | 5/2003 | Lieber | |
| 2003/0103744 A1 | 6/2003 | Koyama | |
| 2003/0132480 A1 | 7/2003 | Chau | |
| 2003/0160176 A1 | 8/2003 | Vispute | |
| 2003/0189202 A1 | 10/2003 | Li | |
| 2003/0227090 A1 | 12/2003 | Okabe | |
| 2004/0011975 A1 | 1/2004 | Nicoli | |
| 2004/0021062 A1 | 2/2004 | Zaidi | |
| 2004/0021602 A1 | 2/2004 | Zaidi | |
| 2004/0026684 A1 | 2/2004 | Empedocles | |
| 2004/0058058 A1 | 3/2004 | Shchegolikhin | |
| 2004/0065362 A1 | 4/2004 | Watabe | |
| 2004/0075464 A1 | 4/2004 | Samuelson | |
| 2004/0095658 A1 | 5/2004 | Buretea et al. | |
| 2004/0109666 A1 | 6/2004 | Kim | |
| 2004/0114847 A1 | 6/2004 | Fischer et al. | |
| 2004/0118337 A1 | 6/2004 | Mizutani | |
| 2004/0118377 A1 | 6/2004 | Bloms | |
| 2004/0122328 A1 | 6/2004 | Wang | |
| 2004/0124366 A1 | 7/2004 | Zeng | |
| 2004/0155247 A1 | 8/2004 | Benthien | |
| 2004/0156610 A1 | 8/2004 | Charlton et al. | |
| 2004/0160522 A1 | 8/2004 | Fossum | |
| 2004/0180461 A1 | 9/2004 | Yaung | |
| 2004/0213307 A1 | 10/2004 | Lieber | |
| 2004/0217086 A1 | 11/2004 | Kawashima | |
| 2004/0223681 A1 | 11/2004 | Block | |
| 2004/0241965 A1 | 12/2004 | Merritt | |
| 2004/0252957 A1 | 12/2004 | Schmidt et al. | |
| 2004/0261840 A1 | 12/2004 | Schmit | |
| 2005/0009224 A1 | 1/2005 | Yang | |
| 2005/0035381 A1 | 2/2005 | Holm | |
| 2005/0082676 A1 | 4/2005 | Andry | |
| 2005/0087601 A1 | 4/2005 | Gerst | |
| 2005/0095699 A1 | 5/2005 | Miyauchi | |
| 2005/0109388 A1 | 5/2005 | Murakami | |
| 2005/0116271 A1 | 6/2005 | Kato | |
| 2005/0133476 A1 | 6/2005 | Islam | |
| 2005/0161662 A1 | 7/2005 | Majumdar et al. | |
| 2005/0164514 A1 | 7/2005 | Rauf | |
| 2005/0190453 A1 | 9/2005 | Dobashi | |
| 2005/0201704 A1 | 9/2005 | Ellwood | |
| 2005/0218468 A1 | 10/2005 | Owen | |
| 2005/0224707 A1 | 10/2005 | Guedj | |
| 2005/0242409 A1 | 11/2005 | Yang | |
| 2005/0284517 A1 | 12/2005 | Shinohara | |
| 2006/0011362 A1 | 1/2006 | Tao | |
| 2006/0027071 A1 | 2/2006 | Barnett | |
| 2006/0038990 A1 | 2/2006 | Habib et al. | |
| 2006/0113622 A1 | 6/2006 | Adkisson | |
| 2006/0115230 A1 | 6/2006 | Komoguchi et al. | |
| 2006/0121371 A1 | 6/2006 | Wu | |
| 2006/0146323 A1 | 7/2006 | Bratkovski | |
| 2006/0162766 A1 | 7/2006 | Gee | |
| 2006/0180197 A1 | 8/2006 | Gui | |
| 2006/0208320 A1 | 9/2006 | Tsuchiya et al. | |
| 2006/0257071 A1 | 11/2006 | Bise | |
| 2006/0260674 A1 | 11/2006 | Tran | |
| 2006/0273262 A1 | 12/2006 | Sayag | |
| 2006/0273389 A1 | 12/2006 | Cohen | |
| 2006/0284118 A1 | 12/2006 | Asmussen | |
| 2007/0012980 A1 | 1/2007 | Duan | |
| 2007/0012985 A1 | 1/2007 | Stumbo | |
| 2007/0023799 A1 | 2/2007 | Boettiger | |
| 2007/0025504 A1 | 2/2007 | Tumer | |
| 2007/0029545 A1 | 2/2007 | Striakhilev | |
| 2007/0052050 A1 | 3/2007 | Dierickx | |
| 2007/0076481 A1 | 4/2007 | Tennant | |
| 2007/0082255 A1 | 4/2007 | Sun | |
| 2007/0099292 A1 | 5/2007 | Miller | |
| 2007/0104441 A1 | 5/2007 | Ahn | |
| 2007/0107773 A1 | 5/2007 | Fork | |
| 2007/0108371 A1 | 5/2007 | Stevens | |
| 2007/0114622 A1 | 5/2007 | Adkisson | |
| 2007/0120254 A1 | 5/2007 | Hurkx | |
| 2007/0126037 A1 | 6/2007 | Ikeda | |
| 2007/0137697 A1 | 6/2007 | Kempa | |
| 2007/0138376 A1 | 6/2007 | Naughton | |
| 2007/0138380 A1 | 6/2007 | Adkisson | |
| 2007/0138459 A1 | 6/2007 | Wong | |
| 2007/0139740 A1 | 6/2007 | Igura | |
| 2007/0140638 A1 | 6/2007 | Yang | |
| 2007/0145512 A1 | 6/2007 | Rhodes | |
| 2007/0148599 A1 | 6/2007 | True | |
| 2007/0152248 A1 | 7/2007 | Choi | |
| 2007/0155025 A1 | 7/2007 | Zhang | |
| 2007/0164270 A1 | 7/2007 | Majumdar | |
| 2007/0170418 A1 | 7/2007 | Bowers | |
| 2007/0172623 A1 | 7/2007 | Kresse | |
| 2007/0187787 A1 | 8/2007 | Ackerson | |
| 2007/0196239 A1 | 8/2007 | Vink | |
| 2007/0200054 A1 | 8/2007 | Reznik | |
| 2007/0205483 A1 | 9/2007 | Williams | |
| 2007/0217754 A1 | 9/2007 | Sasaki | |
| 2007/0228421 A1 | 10/2007 | Shioya | |
| 2007/0238265 A1 | 10/2007 | Kurashina | |
| 2007/0238285 A1 | 10/2007 | Borden | |
| 2007/0241260 A1 | 10/2007 | Jaeger | |
| 2007/0246689 A1 | 10/2007 | Ge | |

(56) References Cited

U.S. PATENT DOCUMENTS

| | | |
|---|---|---|
| 2007/0248958 A1 | 10/2007 | Jovanovich |
| 2007/0272828 A1 | 11/2007 | Xu |
| 2007/0278500 A1 | 12/2007 | Lin |
| 2007/0285378 A1 | 12/2007 | Lankhorst |
| 2007/0290193 A1 | 12/2007 | Tucker |
| 2007/0290265 A1 | 12/2007 | Augusto |
| 2008/0001498 A1 | 1/2008 | Muller |
| 2008/0006319 A1 | 1/2008 | Bettge |
| 2008/0029701 A1 | 2/2008 | Onozawa |
| 2008/0036038 A1 | 2/2008 | Hersee |
| 2008/0044984 A1 | 2/2008 | Hsieh |
| 2008/0047601 A1 | 2/2008 | Nag |
| 2008/0047604 A1 | 2/2008 | Korevaar |
| 2008/0055451 A1 | 3/2008 | Kanbe |
| 2008/0073742 A1 | 3/2008 | Adkisson |
| 2008/0079022 A1 | 4/2008 | Yamamoto |
| 2008/0079076 A1 | 4/2008 | Sheen |
| 2008/0083963 A1 | 4/2008 | Hsu |
| 2008/0088014 A1 | 4/2008 | Adkisson |
| 2008/0090401 A1 | 4/2008 | Bratkovski |
| 2008/0092938 A1 | 4/2008 | Majumdar |
| 2008/0096308 A1 | 4/2008 | Santori |
| 2008/0108170 A1 | 5/2008 | Adkisson |
| 2008/0116537 A1 | 5/2008 | Adkisson |
| 2008/0128760 A1 | 6/2008 | Jun |
| 2008/0137188 A1 | 6/2008 | Sato et al. |
| 2008/0143906 A1 | 6/2008 | Allemand et al. |
| 2008/0145965 A1 | 6/2008 | Reznik |
| 2008/0149914 A1 | 6/2008 | Samuelson et al. |
| 2008/0149944 A1 | 6/2008 | Samuelson |
| 2008/0157253 A1 | 7/2008 | Starikov |
| 2008/0166883 A1 | 7/2008 | Liu |
| 2008/0169017 A1 | 7/2008 | Korevaar |
| 2008/0169019 A1 | 7/2008 | Korevaar |
| 2008/0173615 A1 | 7/2008 | Kim |
| 2008/0178924 A1 | 7/2008 | Kempa |
| 2008/0188029 A1 | 8/2008 | Rhodes |
| 2008/0191278 A1 | 8/2008 | Maekawa |
| 2008/0191298 A1 | 8/2008 | Lin |
| 2008/0211945 A1 | 9/2008 | Hong |
| 2008/0218740 A1 | 9/2008 | Williams |
| 2008/0224115 A1 | 9/2008 | Bakkers |
| 2008/0225140 A1 | 9/2008 | Raynor |
| 2008/0233280 A1 | 9/2008 | Blanchet |
| 2008/0237568 A1 | 10/2008 | Kobayashi |
| 2008/0246020 A1 | 10/2008 | Kawashima |
| 2008/0246123 A1 | 10/2008 | Kamins |
| 2008/0248304 A1 | 10/2008 | Hanrath |
| 2008/0251780 A1 | 10/2008 | Li |
| 2008/0258747 A1 | 10/2008 | Kluth |
| 2008/0260225 A1* | 10/2008 | Szu .............. 382/128 |
| 2008/0264478 A1 | 10/2008 | Ahn |
| 2008/0266556 A1 | 10/2008 | Kamins |
| 2008/0266572 A1 | 10/2008 | Kamins |
| 2008/0271783 A1 | 11/2008 | Murakami |
| 2008/0277646 A1 | 11/2008 | Kim et al. |
| 2008/0283728 A1 | 11/2008 | Inoue |
| 2008/0283883 A1 | 11/2008 | Shim |
| 2008/0297281 A1 | 12/2008 | Ayazi |
| 2008/0311693 A1 | 12/2008 | Maxwell |
| 2008/0311712 A1 | 12/2008 | Anwar |
| 2009/0001498 A1 | 1/2009 | Wang |
| 2009/0020150 A1 | 1/2009 | Atwater |
| 2009/0020687 A1 | 1/2009 | Lehmann et al. |
| 2009/0032687 A1 | 2/2009 | Lapstun |
| 2009/0046362 A1 | 2/2009 | Guo |
| 2009/0046749 A1 | 2/2009 | Mizuuchi |
| 2009/0050204 A1 | 2/2009 | Habib |
| 2009/0052029 A1 | 2/2009 | Dai et al. |
| 2009/0057650 A1 | 3/2009 | Lieber |
| 2009/0072145 A1 | 3/2009 | Peczalski et al. |
| 2009/0104160 A1 | 4/2009 | Young |
| 2009/0120498 A1 | 5/2009 | Yamazaki |
| 2009/0121136 A1 | 5/2009 | Gruss et al. |
| 2009/0127442 A1 | 5/2009 | Lee |
| 2009/0146198 A1 | 6/2009 | Joe |
| 2009/0151782 A1 | 6/2009 | Ko |
| 2009/0152664 A1 | 6/2009 | Klem |
| 2009/0153961 A1 | 6/2009 | Murakami et al. |
| 2009/0165844 A1 | 7/2009 | Dutta |
| 2009/0173976 A1 | 7/2009 | Augusto |
| 2009/0179225 A1 | 7/2009 | Fertig et al. |
| 2009/0179289 A1 | 7/2009 | Park |
| 2009/0188552 A1 | 7/2009 | Wang |
| 2009/0189144 A1 | 7/2009 | Quitoriano |
| 2009/0189145 A1 | 7/2009 | Wang |
| 2009/0194160 A1 | 8/2009 | Chin et al. |
| 2009/0199597 A1 | 8/2009 | Danley |
| 2009/0201400 A1 | 8/2009 | Zhang |
| 2009/0206405 A1 | 8/2009 | Doyle |
| 2009/0223558 A1 | 9/2009 | Sun |
| 2009/0224245 A1 | 9/2009 | Umezaki |
| 2009/0224349 A1 | 9/2009 | Gambino |
| 2009/0230039 A1 | 9/2009 | Hoenig et al. |
| 2009/0233445 A1 | 9/2009 | Lee |
| 2009/0242018 A1 | 10/2009 | Ahn |
| 2009/0243016 A1 | 10/2009 | Kawahara |
| 2009/0244514 A1 | 10/2009 | Jin |
| 2009/0260687 A1 | 10/2009 | Park |
| 2009/0261438 A1 | 10/2009 | Choi |
| 2009/0266418 A1 | 10/2009 | Hu et al. |
| 2009/0266974 A1 | 10/2009 | Verhulst |
| 2009/0272423 A1 | 11/2009 | Niira |
| 2009/0278998 A1 | 11/2009 | El-Ghoroury |
| 2009/0289320 A1 | 11/2009 | Cohen |
| 2009/0305454 A1 | 12/2009 | Cohen |
| 2010/0006817 A1 | 1/2010 | Ohlsson |
| 2010/0019252 A1 | 1/2010 | Bratkovski |
| 2010/0019296 A1 | 1/2010 | Cha |
| 2010/0019355 A1 | 1/2010 | Kamins |
| 2010/0025710 A1 | 2/2010 | Yamada |
| 2010/0078055 A1 | 4/2010 | Vidu |
| 2010/0090341 A1 | 4/2010 | Wan |
| 2010/0101633 A1 | 4/2010 | Park |
| 2010/0104494 A1 | 4/2010 | Meng |
| 2010/0110433 A1 | 5/2010 | Nedelcu et al. |
| 2010/0116976 A1 | 5/2010 | Wober |
| 2010/0126573 A1 | 5/2010 | Youtsey |
| 2010/0127153 A1 | 5/2010 | Agarwal |
| 2010/0132779 A1 | 6/2010 | Hong |
| 2010/0133986 A1 | 6/2010 | Kim |
| 2010/0136721 A1 | 6/2010 | Song |
| 2010/0148221 A1 | 6/2010 | Yu |
| 2010/0163714 A1 | 7/2010 | Wober |
| 2010/0163941 A1 | 7/2010 | Jung |
| 2010/0178018 A1 | 7/2010 | Augusto |
| 2010/0186809 A1 | 7/2010 | Samuelson et al. |
| 2010/0187404 A1 | 7/2010 | Klem |
| 2010/0200065 A1 | 8/2010 | Choi |
| 2010/0207103 A1 | 8/2010 | Farrow |
| 2010/0218816 A1 | 9/2010 | Guha |
| 2010/0229939 A1 | 9/2010 | Shen |
| 2010/0230653 A1 | 9/2010 | Chen |
| 2010/0237454 A1 | 9/2010 | Fujisawa |
| 2010/0244108 A1 | 9/2010 | Kohnke |
| 2010/0244169 A1 | 9/2010 | Maeda |
| 2010/0249877 A1 | 9/2010 | Naughton |
| 2010/0258184 A1 | 10/2010 | Laughlin |
| 2010/0276572 A1 | 11/2010 | Iwabuchi |
| 2010/0277607 A1 | 11/2010 | Choi |
| 2010/0282314 A1 | 11/2010 | Coakley |
| 2010/0295019 A1 | 11/2010 | Wang |
| 2010/0302440 A1 | 12/2010 | Wober |
| 2010/0304061 A1 | 12/2010 | Ye |
| 2010/0308214 A1 | 12/2010 | Wober |
| 2010/0313952 A1 | 12/2010 | Coakley |
| 2010/0319763 A1 | 12/2010 | Park |
| 2010/0320444 A1 | 12/2010 | Dutta |
| 2011/0018424 A1 | 1/2011 | Takada |
| 2011/0036396 A1 | 2/2011 | Jayaraman |
| 2011/0037133 A1 | 2/2011 | Su |
| 2011/0049572 A1 | 3/2011 | Jeon et al. |
| 2011/0050042 A1 | 3/2011 | Choi et al. |
| 2011/0057231 A1 | 3/2011 | Jeon et al. |

(56) References Cited

U.S. PATENT DOCUMENTS

| | | |
|---|---|---|
| 2011/0057234 A1 | 3/2011 | Jeon et al. |
| 2011/0057286 A1 | 3/2011 | Jeon et al. |
| 2011/0080508 A1 | 4/2011 | Katsuno |
| 2011/0084212 A1 | 4/2011 | Clark |
| 2011/0127490 A1 | 6/2011 | Mi |
| 2011/0133060 A1 | 6/2011 | Yu |
| 2011/0133160 A1 | 6/2011 | Yu |
| 2011/0135814 A1 | 6/2011 | Miyauchi |
| 2011/0139176 A1 | 6/2011 | Cheung |
| 2011/0146771 A1 | 6/2011 | Chuang et al. |
| 2011/0147870 A1 | 6/2011 | Ang |
| 2011/0180894 A1 | 7/2011 | Samuelson |
| 2011/0195577 A1 | 8/2011 | Kushibiki |
| 2011/0220191 A1 | 9/2011 | Flood |
| 2011/0226937 A1 | 9/2011 | Yu |
| 2011/0248315 A1 | 10/2011 | Nam |
| 2011/0249219 A1 | 10/2011 | Evans |
| 2011/0249322 A1 | 10/2011 | Wang |
| 2011/0253982 A1 | 10/2011 | Wang |
| 2011/0272014 A1 | 11/2011 | Mathai |
| 2011/0297214 A1 | 12/2011 | Kim |
| 2011/0309237 A1 | 12/2011 | Seo et al. |
| 2011/0309240 A1 | 12/2011 | Yu et al. |
| 2011/0309331 A1 | 12/2011 | Yu |
| 2011/0315988 A1 | 12/2011 | Yu |
| 2011/0316106 A1 | 12/2011 | Kim |
| 2012/0006390 A1 | 1/2012 | Huo et al. |
| 2012/0009714 A1 | 1/2012 | Mouli |
| 2012/0014837 A1 | 1/2012 | Fehr et al. |
| 2012/0029328 A1 | 2/2012 | Shimizu |
| 2012/0031454 A1 | 2/2012 | Fogel |
| 2012/0060905 A1 | 3/2012 | Fogel |
| 2012/0075513 A1 | 3/2012 | Chipman et al. |
| 2012/0153124 A1 | 6/2012 | Yu |
| 2012/0192939 A1 | 8/2012 | Tamboli et al. |
| 2012/0196383 A1 | 8/2012 | Nitkowski et al. |
| 2012/0196401 A1 | 8/2012 | Graham |
| 2012/0240999 A1 | 9/2012 | Yoshida |
| 2012/0258563 A1 | 10/2012 | Ogino |
| 2012/0280345 A1 | 11/2012 | Zhu |
| 2012/0298843 A1 | 11/2012 | Yu |
| 2012/0313078 A1 | 12/2012 | Fukui |
| 2012/0318336 A1 | 12/2012 | Hekmatshoar-Tabari et al. |
| 2012/0322164 A1 | 12/2012 | Lal |
| 2013/0000704 A1 | 1/2013 | Fogel |
| 2013/0020620 A1 | 1/2013 | Wober |
| 2013/0037100 A1 | 2/2013 | Platzer Bjorkman |
| 2013/0112256 A1 | 5/2013 | Yu |
| 2013/0125965 A1 | 5/2013 | Hazeghi |
| 2013/0174904 A1 | 7/2013 | Yamasaki |
| 2013/0220406 A1 | 8/2013 | Day |
| 2013/0341749 A1 | 12/2013 | Yu et al. |
| 2014/0045209 A1 | 2/2014 | Chou |
| 2014/0096816 A1 | 4/2014 | Atwater et al. |
| 2014/0117401 A1 | 5/2014 | Herner |

FOREIGN PATENT DOCUMENTS

| | | |
|---|---|---|
| CN | 100350429 | 11/2007 |
| CN | 101459185 | 6/2009 |
| CN | 100568516 | 12/2009 |
| CN | 101675522 | 3/2010 |
| CN | 101681941 | 3/2010 |
| EP | 0809303 B1 | 9/2006 |
| FR | 2923651 | 5/2009 |
| GB | 2348399 A | 4/2000 |
| JP | 359013708 | 1/1984 |
| JP | 59198413708 | 1/1984 |
| JP | 2000324396 | 11/2000 |
| JP | 2002151715 | 5/2002 |
| JP | 2005252210 | 9/2005 |
| JP | 2005328135 | 11/2005 |
| JP | 2007134562 | 5/2007 |
| JP | 2007152548 | 6/2007 |
| JP | 2007184566 | 7/2007 |
| JP | 2007520877 | 7/2007 |
| JP | 2007201091 | 8/2007 |
| JP | 2007317961 | 12/2007 |
| JP | 2008288585 | 11/2008 |
| JP | 2009506546 | 2/2009 |
| JP | 2009236914 | 10/2009 |
| JP | 2013513253 | 4/2013 |
| JP | 2013513254 | 4/2013 |
| TW | I318418 | 5/2004 |
| TW | I228782 | 3/2005 |
| TW | 200535914 | 11/2005 |
| TW | 200536048 | 11/2005 |
| TW | 200742115 | 4/2007 |
| TW | 200810100 | 2/2008 |
| TW | 200814308 | 3/2008 |
| TW | 200845402 | 11/2008 |
| TW | 200847412 | 12/2008 |
| TW | 200915551 | 4/2009 |
| TW | 200941716 | 10/2009 |
| TW | 201027730 | 7/2010 |
| TW | 201034172 | 9/2010 |
| TW | 201044610 | 12/2010 |
| TW | 201140859 | 11/2011 |
| WO | WO8603347 | 6/1986 |
| WO | WO0002379 | 1/2000 |
| WO | 03107439 A1 | 12/2003 |
| WO | WO2005064337 | 7/2005 |
| WO | WO2008069565 | 6/2008 |
| WO | 2008079076 | 7/2008 |
| WO | WO2008079076 | 7/2008 |
| WO | WO2008131313 | 10/2008 |
| WO | 2008135905 | 11/2008 |
| WO | 2008135905 A3 | 11/2008 |
| WO | WO2008135905 | 11/2008 |
| WO | WO2008143727 | 11/2008 |
| WO | 2008131313 | 12/2008 |
| WO | 2009099841 | 8/2009 |
| WO | WO2009116018 | 9/2009 |
| WO | WO2009137241 | 11/2009 |
| WO | WO2010019887 | 2/2010 |
| WO | WO2010039631 | 4/2010 |
| WO | 2011074457 | 6/2011 |

OTHER PUBLICATIONS

University of California San Diego, Class ECE 183 Lab 1 2013.*
CMOS image sensor pixel microlens array optimization using FDTD Solutions, http://www.lumerical_com/ fdtd_microlens/cmos_image_sensor_pixel_microlens.php, pp. 1-2, Jun. 25, 2008.
Adler, Nanowire Lawns Make for Sheets of Image Sensors, NewScientist.com, Jul. 28, 2008.
Babinec et al., High-Flux, Low-Power Diamond Nanowire Single-Photon Source Arrays: An Enabling Material for Optical and Quantum Computing and Cryptography, obtained on Jul. 22, 2010 at URL: http://otd.harvard.edu/technologies/tech.php?case=3702.
Baillie et al., 'Zero-space microlenses for CMOS image sensors: optical modeling and lithographic process development', Publication Date May 2004, http://adsabs.harvard.edu/abs/2004SPIE.5377.953B, pp. 1-2.
Baomin Wang and Paul W. Leu, Nanotechology 23 (2012) 194003, 7 pages.
Barclay et al., Chip-Based Microcavities Coupled to NV Centers in Single Crystal Diamond, Applied Physics Letters, Nov. 12, 2009, vol. 95, Issue 19.
Brouri et al., Photon Antibunching in the Flurescence of Individual Colored Centers in Diamond, Optics Letters, Sep. 1, 2000, vol. 25, Issue 17.
Chung, Sung-Wook et al. Silicon Nanowire Devices. Applied Physics Letters, vol. 76, No. 15 (Apr. 10, 2000), pp. 2068-2070.
CMOS image sensor pixel optical efficiency and optical crosstalk optimization using FDTD Solutions' www.lumerical.com/fdtd_microlens/cmos_image_sensor_pixel_microlens.php, Mar. 19, 2009.
Deptuch et al., Vertically Integrated Circuits at Fermilab, IEEE Transactions on Nuclear Science, Aug. 2010, vol. 54, Issue 4, pp. 2178-2186.

(56) References Cited

OTHER PUBLICATIONS

Ekroll, on the Nature of Simultaneous Color Contrast, Dissertation, University of Kiel, 2005.
Fan et al., Large-Scale, Heterogeneous Integration of Nanowire Arrays for Image Sensor Circuitry, Proceedings of the National Academy of Sciences (PNAS) of the United States of America, Aug. 12, 2008, vol. 105, No. 32.
Fang et al., Fabrication of Slantingly-Aligned Silicon Nanowire Arrays for Solar Cell Applications, Nanotechnology, 2008, vol. 19, No. 25.
Furumiya, et al. 'High-sensitivity and no-crosstalk pixel technology for embedded CMOS image sensor'; IEEE Electron Device Letters, vol. 48, No. 10, Oct. 2001.
Gadelrab et al., The Source-Gated Amorphous Silicon Photo-Transistor, IEEE Transactions on Electron Devices, Oct. 1997, vol. 44, No. 10, pp. 1789-1794.
Gambino et al., 'CMOS Imager with Copper Wiring and Lightpipe,' Electron Devices Meeting, 2006. IEDM '06, International Publication Date: Dec. 11-13, 2006, pp. 1-4.
Garnett et al., Light Trapping in Silicon Nanowire Solar Cells, Nanoletters, Jan. 28, 2010, vol. 10, No. 3, pp. 1082-1087.
Ge et al., Orientation-Controlled Growth of Single-Crystal Silicon-Nanowire Arrays, Advanced Materials, Jan. 18, 2005, vol. 17, No. 1, pp. 56-61.
Guillaumée, et al., Polarization Sensitive Silicon Photodiodes Using Nanostructured Metallic Grids, Applied Physics Letters 94, 2009.
Hanrath et al., Nucleation and Growth of Germanium Nanowires Seeded by Organic Monolayer-Coated Gold Nanocrystals, J. Am. Chem. Soc., Feb. 20, 2002, vol. 124, No. 7, pp. 1424-1429.
Hanrath et al., Supercritical Fluid-Liquid-Solid (SFLS) Synthesis of Si and Ge Nanowires Seeded by Colloidal Metal Nanocrystals, Advanced Materials, Mar. 4, 2003, vol. 15, No. 5, pp. 437-440.
Hochbaum et al., Controlled Growth of Si Nanowire Arrays for Device Integration, Nano Letters, Mar. 2005, vol. 5, No. 3, pp. 457-460.
Holmes et al., Control of Thickness and Orientation of Solution-Grown Silicon Nanowires, Science, Feb. 25, 2000, vol. 287, No. 5457, pp. 1471-1473.
International Preliminary Report and Written Opinion re PCT/US2010/059468, mailed Jun. 21, 2012.
International Preliminary Report and Written Opinion re PCT/US2010/059491, mailed Jun. 21, 2012.
International Preliminary Report and Written Opinion re PCT/US2010/059496, mailed Jun. 21, 2012.
International Preliminary Report and Written Opinion re PCT/US2010/059504, mailed Jun. 21, 2012.
International Preliminary Report on Patentability for PCT International Application No. PCT/US2010/035722, mailed Nov. 3, 2011.
International Preliminary Report on Patentability for PCT International Patent Application No. PCT/U62009/055963, mailed Mar. 17, 2011.
International Preliminary Search Report on Patentability of PCT/US201-057325, mailed May 2, 2013.
International Search Report and Written Opinion for PCT International Application No. PCT/US2010/035722, mailed Jul. 20, 2010.
International Search Report and Written Opinion for PCT International Application No. PCT/US2010/035726, mailed Jul. 21, 2010.
International Search Report and Written Opinion for PCT International Application No. PCT/US2010/057227, mailed Jan. 26, 2011.
International Search Report and Written Opinion for PCT International Patent Application No. PCT/US2009/055963, mailed Oct. 15, 2009.
International Search Report and Written Opinion for PCT International Patent Application No. PCT/US2009/063592, mailed Jan. 13, 2010.
International Search Report and Written Opinion for PCT International Patent Application No. PCT/US2010/035727, mailed Sep. 27, 2010.
International Search Report and Written Opinion for PCT International Patent Application No. PCT/US2010/051435, mailed Dec. 3, 2010.
International Search Report and Written Opinion for PCT International Patent Application No. PCT/US2010/051446, mailed Jan. 3, 2011.
International Search Report and Written Opinion for PCT International Patent Application No. PCT/US2010/059468, mailed Feb. 11, 2011.
International Search Report and Written Opinion for PCT International Patent Application No. PCT/US2010/059491, mailed Feb. 9, 2011.
International Search Report and Written Opinion for PCT International Patent Application No. PCT/US2010/059501, mailed Feb. 15, 2011.
International Search Report and Written Opinion for PCT International Patent Application No. PCT/US2010/059504, mailed Apr. 7, 2011.
International Search Report and Written Opinion for PCT International Patent Application No. PCT/US2011/060348, mailed Mar. 9, 2012.
International Search Report and Written Opinion for PCT International Patent Application No. PCT/US2011/064635, mailed Apr. 13, 2012.
International Search Report and Written Opinion for PCT International Patent Application No. PCT/US2011/066097, mailed Mar. 12, 2012.
International Search Report and Written Opinion for PCT International Patent Application No. PCT/US2011/067712, mailed May 3, 2012.
International Search Report and Written Opinion re PCT/US2011/57325, mailed Jun. 22, 2012.
Jin-Kon Kim; 'New Functional Nanomaterials Based on Block Copolymers' http://www.ziu.edu.cn/adver/subjectizyhd/jz0707061313.html, Jul. 7, 2011.
Juan et al., High Aspect Ratio Polymide Etching Using an Oxygen Plasma Generated by Electron Cyclotron Resonance Source, Journal of Vacuum Science and Technology, Jan./Feb. 1994, vol. 12, No. 1., pp. 422-426.
Junger, et. al., Polarization- and wavelength-sensitive sub-wavelength structures fabricated in the metal layers of deep submicron CMOS processes, Proc. of SPIE, vol. 7712, 2010.
Kalkofen et al., Atomic Layer Deposition of Boron Oxide As Dopant Source for Shallow Doping of Silicon, Meeting Abstract 943, 217th ECS Meeting, MA2010-01, Apr. 25-30, 2010, Vancouver Canada, EI—Advanced Gate Stack, Source / Drain, and Channel Engineering for Si-Based CMOS 6: New Materials, Processes, and Equipment.
Kane, Why Nanowires Make Great Photodetectors, EurekAlert.com article, Apr. 25, 2007.
Kempa, Thomas J. et al. Single and Tandem Axial p-i-n Nanowire Photovoltaic Devices. Nano Letters. 2008, vol. 8, No. 10, 3456-3460.
Kim et al., Electronic Structure of Vertically Aligned Mn-Doped CoFe2O4 Nanowires and Their Application as Humidity Sensors and Photodetectors, Journal of Physical Chemistry C, Apr. 7, 2009.
Law, et al., 'Semiconductor Nanowires and Nanotubes'; Annu. Rev. Mater. Res. 2004, 34:83-122.
Lee et al., Vertical Pillar-Superlattice Array and Graphene Hybrid Light Emitting Diodes, Nano Letters, 2010, vol. 10, pp. 2783-2788.
Lin et al., Fabrication of Nanowire Anisotropic Conductive Film for Ultra-fine Pitch Flip Chip Interconnection, Electronic Components and Technology Conference, Jun. 20, 2005, 55th Proceedings, pp. 66-70.
Lin et al., Reducing Dark Current in a High-Speed Si-Based Interdigitated Trench-Electrode MSM Photodetector, IEEE Transactions on Electron Devices, May 2003, vol. 50, No. 5, pp. 1306-1313.
Loncar et al., Diamond Nanotechnology, SPIE Newsroom, May 18, 2010, obtained at url: http://spie.org/x40194.xml?ArticleID=x40194.
Loose et al., CMOS Detector Technology, Scientific Detector Workshop, Sicily, 2005, Experimental Astronomy, vol. 19, Issue 1-3, pp. 111-134.

(56) References Cited

OTHER PUBLICATIONS

Lu et al., Growth of Single Crystal Silicon Nanowires in Supercritical Solution from Tethered Gold Particles on a Silicon Substrate, NanoLetters, Jan. 2003, vol. 3, No. 1, pp. 93-99.
Lugstein et al., Ga/Au Alloy Catalyst for Single Crystal Silicon-Nanowire Epitaxy, Applied Physics Letters, Jan. 8, 2007, vol. 90, No. 2, pp. 023109-1-023109-3.
Madou, Properties and Growth of Silicon, Including Crystalline Silicon, Fundamentals of Microfabrication, 2nd Ed., CRC Press, 2002, pp. 125-204.
Makarova et al., Fabrication of High Density, High-Aspect-Ratio Polyimide Nanofilters, Journal of Vacuum Science and Technology, Nov./Dec. 2009, vol. 27, No. 6., pp. 2585-2587.
Morales et al., A Laser Ablation Method for the Synthesis of Crystalline Semiconductor Nanowires, Science, Jan. 9, 1998, vol. 279, pp. 208-211.
N.L. Dmitruk, et al.; 'Modeling and Measurement of Optical Response of 1D Array of Metallic Nanowires for Sensing and Detection Application'; 26th International Conference on Microelectronics (MIEL 2008), NIS, Serbia, May 11-14, 2008.
Nguyen et al., Deep Reactive Ion etching of Polyimide for Microfluidic Applications, Journal of the Korean Physical Society, Sep. 2007, vol. 51, No. 3, pp. 984-988.
Ozgur Yavuzcetin, et al.; 'Index-tuned Anti-reflective Coating using a Nanostructured Metamaterial'; http://www.umass.edu/research/rld/bioportal/vuewtech.php?tid=40, Feb. 28, 2007.
Pain et al., A Back-Illuminated Megapixel CMOS Image Sensor, IEEE Workshop on Charge-Coupled Devices and Advanced Image Sensors, Karuizawa, Japan, Jun. 9-11, 2005, Jet Propulsion Laboratory, National Aeronautics and Space Administration, Pasadena California.
Parraga et al., Color and Luminance Information in Natural Scenes, Journal of Optical Society of America A, Optics, Image, Science and Vision, Jun. 1998, vol. 15, No. 6.
Reynard Corporation; 'Anti-Reflection Coatings (AR)', http://www.reynardcorp.com/coating_anti_reflection.php, undated.
Rosfjord et al., Nanowire Single-Photon Detector with an Integrated Optical Cavity and Anti-Reflection Coating, Optics Express: The International Electronic Journal of Optics, Jan. 23, 2006, vol. 14, No. 2, pp. 527-534.
Rugani, First All-Nanowire Sensor, Technology Review, Aug. 13, 2008, Published by MIT.
Rutter, Diamond-Based Nanowire Devices Advance Quantum Science, SEAS Communications, Feb. 14, 2010, obtained at url:http://news.harvard.edu/gazette/story/2010/02/digging-deep-into-diamonds/.
Sangmoo Jeon, et al., Nano Lett. 2012, 12, 2971-2976.
Sangmoo Jeong et al., J. Vac. Sci. Technol. A 30(6), Nov./Dec. 2012.
Sarkar et. al., Integrated polarization-analyzing CMOS image sensor for detecting incoming light ray direction, Sensors Application Symposium (SAS), Mar. 29, 2012, p. 194-199, 1010 IEEE.
Schmidt et al., Realization of a Silicon Nanowire Vertical Surround-Gate Field-Effect Transistor, Small, Jan. 2006, vol. 2, No. 1, pp. 85-88.
Shimizu et al., Homoepitaxial Growth of Vertical Si Nanowires on Si(100) Substrate using Anodic Aluminum Oxide Template, (abstract only), Materials Research Society, Fall 2007.
Song et al., Vertically Standing Ge Nanowires on GaAs(110) Substrates, Nanotechnology 19, Feb. 21, 2008.
T. H. Hsu, et al. 'Light Guide for Pixel Crosstalk Improvement in Deep Submicron CMOS Image Sensor'; IEEE Electron Device Letters, vol. 25, No. 1, Jan. 2004.
Thelander et al., Nanowire-Based One-Dimensional Electronics, Materials Today, Oct. 2006, vol. 9, No. 10, pp. 28-35.
Trentler, Timothy J. et al. Solution-Liquid-Solid Growth of Cyrstalline III-V Semiconductors: An Analogy to Vapor Liquid-Solid Growth. vol. 270(5243), Dec. 15, 1995, pp. 1791-1794.
Tseng, et al. 'Crosstalk improvement technology applicable to 0.14μm CMOS image sensor'; IEEE International Electron Devices Meeting, Dec. 13-15, 2004; IEDM Technical Digest, pp. 997-1000.
Verheijen, Marcel A. et al. Growth Kinetics of Heterostructured GaP-GaAs Nanowires. J. Am. Chem. Soc. 2006, 128, 1353-1359.
Wagner, R.S. and Ellis, W.C. Vapor-Liquid-Solid Mechanism of Single Crystal Growth. Applied Physics Letters. vol. 4, No. 5 (Mar. 1, 1964), pp. 89-90.
Wang, Introduction to Nanotechnology—Where Opportunities arise Great Future Being Built from Small Things, Fall 2008.
William Shockley and H. Queisser, Detailed Balance Limit of Efficiency of p-n. Junction Solar Cells, J. of Appl. Physics, Mar. 1961, 32(3).
Wong et al., Lateral Nanoconcentrator Nanowire Multijunction Photovoltaic Cells, GCEP Progress report, Apr. 20, 2009, pp. 1-18.
Ye et al., Fabrication Techniques of High Aspect Ratio Vertical Lightpipes Using a Dielectric Photo Mask, SPIE, Proceedings, Feb. 2010, vol. 7591.
Zhang et al., Ultrahigh Responsivity Visible and Infrared Detection Using Silicon Nanowire Phototransistors, Nanoletters, May 14, 2010, vol. 10, No. 6, pp. 2117-2120.
U.S. Office Action for U.S. Appl. No. 13/048,635, mailed Jun. 6, 2013, 24 pages.
U.S. Office Action for U.S. Appl. No. 12/966,535, mailed Jun. 14, 2013, 22 pages.
U.S. Office Action for U.S. Appl. No. 13/966,573, dated Aug. 6, 2013, 13 pages.
U.S. Office Action for U.S. Appl. No. 12/966,514, dated Aug. 15, 2013, 17 pages.
U.S. Office Action for U.S. Appl. No. 12/633,313, dated Aug. 1, 2013, 20 pages.
Taiwanese Office Action of Taiwan Patent Application No. 099116881, issued Jul. 18, 2013 (8 pages).
U.S. Office Action for U.S. Appl. No. 12/573,582, dated Jun. 28, 2012.
U.S. Office Action for U.S. Appl. No. 13/494,661, notification date Nov. 7, 2012.
Canadian Office Action of Canadian Application No. 3,676,376, dated Oct. 11, 2013.
Catrysse, et al., An Integrated Color Pixel in 0.18pm CMOS Technology, Proceedings IEDM 2001, pp. 559-562.
Choi et al., Optimization of sidewall roughness in silica waveguides to reduce propagation losses, May 2001, Lasers and Electro-Optics, 2001. CLEO '01. Technical Digest. Summaries of papers presented at the Conference on, pp. 175-176.
Geyer et al., Model for the Mass Transport during Metal-Assisted Chemical Etching with Contiguous Metal Films as Catalysts, J. Phys. Chem. C 2012, 116, 13446-13451.
Hopkins, Addressing sidewall roughness using dry etching silicon and Si02, Jul. 1, 2004, ElectroIQ, vol. 47, Issue 7.
Mei-Ling Kuo et al. "Realization of a near-perfect antireflection coating for silicon solar energy utilization" (Nov. 1, 2008, vol. 33, No. 21, Optics Letters).
Mukhopadhyay, When PDMS Isn't the Best, American Chemical Society, May 1, 2007.
Seo, et. al., "Multicolored vertical silicon nanowires," Nano Letters, vol. 11 issue 4, pp. 1851-1856, 2010.
U.S. Final Office Action for U.S. Appl. No. 12/966,514, mailed Mar. 19, 2013, 50 pages.
U.S. Final Office Action for U.S. Appl. No. 13/494,661, mailed Mar. 7, 2013, 10 pages.
Office Action issued on Jan. 28, 2014 in Taiwanese Application No. 100146327.
Office Action issued on Mar. 17, 2014 in Korean Application No. 10-2013-7018243.
Office Action issued on Mar. 3, 2014 in Chinese Application No. 200980142671.9.
U.S. Office Action for U.S. Appl. No. 12/910,664, mailed Feb. 26, 2014.
U.S. Office Action for U.S. Appl. No. 12/945,492 mailed May 13, 2014.
U.S. Office Action for U.S. Appl. No. 12/966,514, mailed Feb. 25, 2014.
U.S. Office Action for U.S. Appl. No. 14/021,672 mailed May 9, 2014.
Office Action for U.S. Appl. No. 12/633,313 mailed Aug. 1, 2014.

(56) References Cited

OTHER PUBLICATIONS

Office Action issued on Jun. 19, 2014 in Taiwanese Application No. 099133891.
U.S. Office Action for U.S. Appl. No. 12/982,269 mailed Jun. 11, 2014.
U.S. Office Action for U.S. Appl. No. 13/106,851 mailed May 29, 2014.
U.S. Office Action for U.S. Appl. No. 13/556,041 mailed Jun. 12, 2014.
U.S. Office Action for U.S. Appl. No. 12/966,514 mailed Sep. 23, 2014.
Berstein et al., "Modern Physics", Chapter 14, Section 6, pp. 420-421, 2000, Prentice-Hall, Inc.
University of California San Diego, Class ECE 183 Lab 1, 2013.
U.S. Office Action for U.S. Appl. No. 13/693,207 mailed Oct. 9, 2014.
Kosonocky, et al., 160 × 244 Element PtSi Schottky-Barrier IR-CCD Image Sensor, IEEE Transactions on Electron Devices, vol. Ed-32, No. 8, Aug. 1985.
Office Action issued May 22, 2015 in Taiwanese Application No. 099142971.
Office Action mailed May 26, 2015 in Japanese Application No. 2014 138265.
Office Action for U.S. Appl. No. 14/068,864 mailed Jun. 15, 2015.
Office Action issued on May 5, 2015 in Chinese Application No. 201410264248.9.
Office Action for U.S. Appl. No. 13/693,207 mailed May 7, 2015.
Kim, Y.S. et al., "ITO/AU/ITO multilayer thin films for transparent conducting electrode applications", Applied Surface Science, vol. 254 (2007), pp. 1524-1527.
Philipp, H.R. et al., "Optical Constants of Silicon in the Region 1 to 10 ev", Physical Review, vol. 120, No. 1, pp. 37-38.
Office Action for U.S. Appl. No. 13/543,307 mailed Apr. 17, 2015.
Office Action issued Mar. 19, 2015 in Chinese Application No. 201180065814.8.
Office Action for U.S. Appl. No. 13/288,131 mailed Apr. 17, 2015.
Office Action issued on Mar. 18, 2015 in Chinese Application No. 201180066970.6.
Office Action issued Apr. 3, 2015 in Chinese Application No. 201180051048.X.
Office Action issued May 15, 2015 in U.S. Appl. No. 14/274,448.
Office Action for U.S. Appl. No. 12/982,269 mailed May 22, 2015.
U.S. Office Action for U.S. Appl. No. 14/274,448 mailed Dec. 5, 2014.
Office Action issued on Oct. 29, 2014 in Korean Application No. 10-2013-7020107.
Corrected Notice of Allowability issued on Oct. 14, 2014 in U.S. Appl. No. 12/966,535.
U.S. Office Action for U.S. Appl. No. 13/543,307 mailed Dec. 24, 2014.
International Search Report and Written Opinion for International Application No. PCT/US2014/056558 mailed Dec. 12, 2014.
Office Action issued on Nov. 11, 2014 in Taiwanese Application No. 098129911.
Notice of Allowance issued on Dec. 1, 2014 in U.S. Appl. No. 12/910,664.
Notice of Allowance issued Jan. 30, 2015 in U.S. Appl. No. 14/487,375.
International Search Report and Written Opinion for International Application No. PCT/US2014/050544 mailed Jan. 9, 2015.
Office Action for U.S. Appl. No. 12/982,269, mailed Jan. 15, 2015.
Office Action for U.S. Appl. No. 12,945,492 mailed Jan. 16, 2015.
Office Action for U.S. Appl. No. 13/963,847 mailed Mar. 12, 2015.
Office Action for U.S. Appl. No. 12/966,514 mailed Mar. 10, 2015.
Office Action issued on Jan. 16, 2015 in Chinese Application No. 201180054442.9.
Office Action issued on Mar. 4, 2015 in U.S. Appl. No. 13/556,041.
Office Action for U.S. Appl. No. 14/281,108 mailed Apr. 6, 2015.
Office Action for U.S. Appl. No. 14/450,812 mailed Apr. 1, 2015.
Office Action for U.S. Appl. No. 12/633,313 mailed Apr. 9, 2015.
Office Action for U.S. Appl. No. 14/450,812 mailed Jul. 23, 2015.
Office Action for U.S. Appl. No. 14/293,164 mailed Aug. 14, 2015.
Office Action issued Aug. 12, 2015 in Chinese Application No. 201180054442.9.
Office Action mailed Sep. 30, 2015 in Japanese Application No. 2014-094365.
Office Action issued Jul. 9, 2015 in Taiwanese Application No. 102124069.
A. Gu et al., "Design and growth of III-V nanowire solar cell arrays on low cost substrates," Conf. Record, 35rd IEEE Photovoltaic Specialists Conference, Honolulu, Jun. 2010, pp. 20-25.
Office Action issued Jun. 23, 2015 in Chinese Application No. 201310284409.6.
Office Action for U.S. Appl. No. 12/966,514 mailed Nov. 2, 2015.
Office Action for U.S. Appl. No. 12/633,313 mailed Oct. 21, 2015.
Office Action for U.S. Appl. No. 13/963,847 mailed Sep. 1, 2015.
Office Action for U.S. Appl. No. 12/945,492 mailed Sep. 9, 2015.
Office Action for U.S. Appl. No. 14/459,398 mailed Sep. 16, 2015.
Office Action for U.S. Appl. No. 14/274,448 mailed Aug. 26, 2015.
Office Action for U.S. Appl. No. 13/288,131 mailed Oct. 22, 2015.
Office Action for U.S. Appl. No. 12/945,429 mailed Sep. 4, 2015.
Office Action dated Oct. 6, 2015 in Taiwanese Application No. 100141376.
Office Action dated Sep. 11, 2015 in Taiwanese Application No. 103143553.
International Search Report and Written Opinion mailed Nov. 27, 2015 in International Application No. PCT/US2015/038999.
Office Action for U.S. Appl. No. 14/450,812 mailed Oct. 28, 2015.
Office Action issued Jan. 4, 2016 in U.S. Appl. No. 14/311,954.
Office Action issued Jan. 5, 2016 in U.S. Appl. No. 14/291,888.
Office Action issued Nov. 9, 2015 in U.S. Appl. 14/503,598.
Office Action issued Jan. 15, 2016 in U.S. Appl. No. 14/632,739.
Office Action issued Jan. 4, 2016 in U.S. Appl. No. 14/293,164.
Office Action issued Jan. 7, 2016 in U.S. Appl. No. 14/322,503.
Office Action issued Jan. 14, 2016 in U.S. Appl. No. 14/459,398.
Office Action issued on Nov. 25, 2015 in Japanese Application No. 2015-005091.
Office Action issued Nov. 17, 2015 in Taiwanese Application 103102171.
Office Action issued Nov. 20, 2015 in Taiwanese Application 104108370.
Office Action issued on Nov. 27, 2015 in Taiwanese Application No. 100138526.
International Search Report and Written Opinion mailed Jan. 8, 2016 in International Application No. PCT/US2015/055728.

\* cited by examiner

Integrated circuits with optical device in substrate

Integrated circuits with optical device in substrate (no passivation layer)

Apply ~2 μm thick photoresist with 1:10 etch ratio

UV expose-develop-postbake photoresist; etch photoresist to create an opening

Deep reactive ion etch (RIE)

Remove photoresist

Contact Metal layer in Cavity

Apply e-beam resist by vapor deposition

Remove e-beam resist at location for gold/metal/catalyst for growing nanowire

Apply gold layer by sputtering or evaporating gold

Form gold particle by lifting off photoresist and gold
– Thickness and diameter of the gold particle influences the nanowire diameter Plasma enhanced vapor-liquid-solid silicon nanowire growth Conformal dielectric coating by chemical vapor deposition (CVD), atomic layer deposition (ALD), oxidation or nitridation Doped glass deposition by plasma-enhanced chemical vapor deposition (PECVD), chemical vapor deposition (CVD), spin-on, sputtering, optionally with an initial ALD Chemical-mechanical planarization (CMP) or etchback of doped glass Coupler generation - Deposition of glass/oxide/dielectric by CVD, sputter deposition or spin-on Coupler generation - Photoresist application Coupler generation – Removal of photoresist outside of opening over nanowire by lithography Coupler generation - Semi-isotropic etch in the glass/oxide/dielectric layer Plasma enhanced vapor-liquid-solid silicon nanowire growth Plasma enhanced vapor-liquid-solid silicon nanowire growth

VERTICAL WAVEGUIDES WITH VARIOUS FUNCTIONALITY ON INTEGRATED CIRCUITS

CROSS REFERENCE TO RELATED APPLICATION

This application is a continuation of U.S. application Ser. No. 12/270,233 filed Nov. 13, 2008 (now U.S. Pat. No. 8,274,039, issued Sep. 25, 2012), which is hereby incorporated by reference in its entirety.

This application is related to the disclosures of U.S. patent application Ser. Nos. 12/204,686, filed Sep. 4, 2008 (now U.S. Pat. No. 7,646,943, issued Jan. 12, 2010), Ser. No. 12/648,942, filed Dec. 29, 2009 (now U.S. Pat. No. 8,229,255, issued Jul. 24, 2012), Ser. No. 13/556,041, filed Jul. 23, 2012, Ser. No. 13/570,027, filed Aug. 8, 2012 (now U.S. Pat. No. 8,471,190, issued Jun. 25, 2013), Ser. No. 12/472,264, filed May 26, 2009 (now U.S. Pat. No. 8,269,985, issued Sep. 18, 2012), Ser. No. 13/621,607, filed Sep. 17, 2012 (now U.S. Pat. No. 8,514,411, issued Aug. 20, 2013), Ser. No. 13/971,523, filed Aug. 20, 2013 (now U.S. Pat. No. 8,810,808, issued Aug. 19, 2014), Ser. No. 14/459,398, filed Aug. 14, 2014, Ser. No. 12/472,271, filed May 26, 2009 (now abandoned), Ser. No. 12/478,598, filed Jun. 4, 2009 (now U.S. Pat. No. 8,546,742, issued Oct. 1, 2013), Ser. No. 14/021,672, filed Sep. 9, 2013 (now U.S. Pat. No. 9,177,985, issued Nov. 3,2015), Ser. No. 12/573,582, filed Oct. 5,2009 (now U.S. Pat. No. 8,791,470, issued Jul. 29, 2014), Ser. No. 14/274,448, filed May 9, 2014, Ser. No. 12/575,221, filed Oct. 7, 2009 (now U.S. Pat. No. 8,384,007, issued Feb. 26, 2013), Ser. No. 12/633,323, filed Dec. 8, 2009 (now U.S. Pat. No. 8,735,797, issued May 27, 2014), Ser. No. 14/068,864, filed Oct. 31, 2013 (now U.S. Pat. No. 9,263,613, issued Feb. 16, 2016), Ser. No. 14/281,108, filed May 19, 2014 (now U.S. Pat. No. 9,123,841, issued Sep. 1, 2015), Ser. No. 13/494,661, filed Jun. 12, 2012 (now U.S. Pat. No. 8,754,359, issued Jun. 17, 2014), Ser. No. 12/633,318, filed Dec. 8, 2009 (now U.S. Pat. No. 8,519,379, issued Aug. 27, 2013), Ser. No. 13/975,553, filed Aug. 26, 2013 (now U.S. Pat. No. 8,710,488, issued Apr. 29, 2014), Ser. No. 12/633,313, filed Dec. 8, 2009, Ser. No. 12/633,305, filed Dec. 8, 2009 (now U.S. Pat. No. 8,299,472, issued Oct. 30, 2012), Ser. No. 13/543,556, filed Jul. 6, 2012 (now U.S. Pat. No. 8,766,272, issued Jul. 1, 2014), Ser. No. 14/293,164, filed Jun. 2, 2014, Ser. No. 12/621,497, filed Nov. 19, 2009 (now abandoned), Ser. No. 12/633,297, filed Dec. 8, 2009 (now U.S. Pat. No. 8,889,455, issued Nov. 18, 2014), Ser. No. 14/501,983 filed Sep. 30, 2014, Ser. No. 12/982,269, filed Dec. 30, 2010, Ser. No. 12/966,573, filed Dec. 13, 2010 (now U.S. Pat. No. 8,866,065, issued Oct. 21, 2014), Ser. No. 14/503,598, filed Oct. 1, 2014, Ser. No. 12/967,880, filed Dec. 14, 2010 (now U.S. Pat. No. 8,748,799, issued Jun. 10, 2014), Ser. No. 14/291,888, filed May 30, 2014, Ser. No. 12/966,5 14, filed Dec. 13, 2010, Ser. No. 12/974,499, filed Dec. 21, 2010 (now U.S. Pat. No. 8,507,840, issued Aug. 13, 2013), Ser. No. 12/966,535, filed Dec. 13, 2010 (now U.S. Pat. No. 8,890,271, issued Nov. 18, 2014), Ser. No. 12/910,664, filed Oct. 22, 2010 (now U.S. Pat. No. 9,000,353 issued Apr. 7, 2015), Ser. No. 14/632,739, filed Feb. 26, 2015, Ser. No. 12/945,492, filed Nov. 12, 2010, Ser. No. 13/047,392, filed Mar. 14, 2011 (now U.S. Pat. No. 8,835,831, issued Sept. 16, 2014), Ser. No. 14/450,812, filed Aug. 4, 2014, Ser. No. 13/048,635, filed Mar. 15, 2011 (now U.S. Pat. No. 8,835,905, issued Sep. 16, 2014), Ser. No. 13/106,851, filed May 12, 2011, Ser. No. 13/288,131, filed Nov. 3,2011, Ser. No. 14/334,848, filed Jul. 18, 2014, Ser. No. 14/032,166, filed Sep. 19, 2013, Ser. No. 13/543,307, filed Jul. 6, 2012, Ser. No. 13/963,847, filed Aug. 9, 2013, Ser. No. 13/693,207, filed Dec. 4, 2012, 61/869,727, filed Aug. 25, 2013, Ser. No. 14/322,503, filed Jul. 2, 2014, and Ser. No. 14/311,954, filed Jun. 23, 2014, Ser. No. 14/563,781, filed Dec. 8, 2014, 61/968,816, filed Mar. 21, 2014, Ser. No. 14/516,402, filed Oct. 16, 2014, Ser. No. 14/516,162, filed Oct. 16, 2014, and 62/161,485, filed May 14, 2015 are each hereby incorporated by reference in their entirety.

FIELD OF INVENTION

The embodiments relate to an integrated circuit manufacture, more particularly, light detecting devices such as a photodiode (PD) comprising of a nanowire.

BACKGROUND

An image sensor has a large number of identical sensor elements (pixels), generally greater than 1 million, in a Cartesian (square) grid. The distance between adjacent pixels is called the pitch (p). The area of a pixel is $p^2$. The area of the photosensitive element, i.e., the area of the pixel that is sensitive to light for conversion to an electrical signal, is normally only about 20% to 30% of the surface area of the pixel.

The challenge of a designer is to channel as much of the light impinging on the pixel to the photosensitive element of the pixel. There are a number of factors that diminish the amount of light from reaching the photosensitive element. One factor is the manner in which the image sensor is constructed. Today the dominating type of photodiodes (PDs) are built on a planar technology by a process of etching and depositing a number of layers of oxides of silicon, metal and nitride on top of crystalline silicon. The PN junction is constructed as a plurality of layers on a substrate giving a device with an essentially horizontal orientation. The light-detection takes place in a subset of these layers.

The layers of a typical sensor are listed in Table I and shown in FIG. 1.

TABLE I

| | Typical Layer Description | Thickness (µm) |
|---|---|---|
| 15 | OVERCOAT | 2.00 |
| 14 | MICRO LENS | 0.773 |
| 13 | SPACER | 1.40 |
| 12 | COLOR FILTER | 1.20 |
| 11 | PLANARIZATION | 1.40 |
| 10 | PASS3 | 0.600 |
| 9 | PASS2 | 0.150 |
| 8 | PASS1 | 1.00 |
| 7 | IMD5B | 0.350 |
| 6 | METAL3 | 31.18 |
| 5 | IMD2B | 0.200 |
| 4 | METAL2 | 21.18 |
| 3 | IMD1B | 0.200 |
| 2 | METAL1 | 1.18 |
| 1 | ILD | 0.750 |

In Table I, typically the first layer on a silicon substrate is the ILD layer and the topmost layer is the overcoat. In Table I, ILD refers to a inter-level dielectric layer, METAL1, METAL2 and METAL3 refer to different metal layers, IMD1B, IMD2B and IMD5B refer to different inter-metal dielectric layers which are spacer layers, PASS1, PASS2 and PASS3 refer to different passivation layers (typically dielectric layers).

The total thickness of the layers above the silicon substrate of the image sensor is the stack height (s) of the image sensor and is the sum of the thickness of the individual layers. In the example of Table I, the sum of the thickness of the individual layers is about 11.6 micrometers (μm).

The space above the photosensitive element of a pixel must be transparent to light to allow incident light from a full color scene to impinge on the photosensitive element located in the silicon substrate. Consequently, no metal layers are routed across the photosensitive element of a pixel, leaving the layers directly above the photosensitive element clear.

The pixel pitch to stack height ratio (p/s) determines the cone of light (F number) that can be accepted by the pixel and conveyed to the photosensitive element on the silicon. As pixels become smaller and the stack height increases, this number decreases, thereby lowering the efficiency of the pixel.

More importantly, the increased stack height with greater number of metal layers obscure the light from being transmitted through the stack to reach the photosensitive element, in particular of the rays that impinge the sensor element at an angle. One solution is to decrease the stack height by a significant amount (i.e., >2 μm). However, this solution is difficult to achieve in a standard planar process.

Another issue, which possibly is the one that most limits the performance of the conventional image sensors, is that less than about one-third of the light impinging on the image sensor is transmitted to the photosensitive element such as a photodiode. In the conventional image sensors, in order to distinguish the three components of light so that the colors from a full color scene can be reproduced, two of the components of light are filtered out for each pixel using a filter. For example, the red pixel has a filter that absorbs green and blue light, only allowing red light to pass to the sensor.

The development of nanoscale technology and in particular the ability to produce nanowires has opened up possibilities of designing structures and combining materials in ways not possible in planar technology. One basis for this development is that the material properties of a nanowire makes it possible to overcome the requirement of placing a color filters on each photo diode of an image sensor and to significantly increase the collection of all the light that impinges on the image sensor.

Nanowires of silicon can be grown on silicon without defects. In US 20040075464 by Samuelson et al. a plurality of devices based on nanowire structures are disclosed.

DESCRIPTION OF THE FIGURES

FIGS. 3-1 to 3-19 show different steps for the formation of the light pipe of the image sensor of an embodiment.

FIG. 4 shows the step of growing a nanowire having a PN junction during the formation of the light pipe of the image sensor of an embodiment.

FIG. 5 shows the step of growing a nanowire having PIN junction during the formation of the light pipe of the image sensor of an embodiment.

FIG. 6 shows an embodiment of an array of nanowires within a single cavity of the image sensor of an embodiment.

FIG. 7 shows a schematic of a top view of a device containing image sensors of the embodiments disclosed herein, each image sensor having two outputs representing the complementary colors.

DETAILED DESCRIPTION

Figure 1:
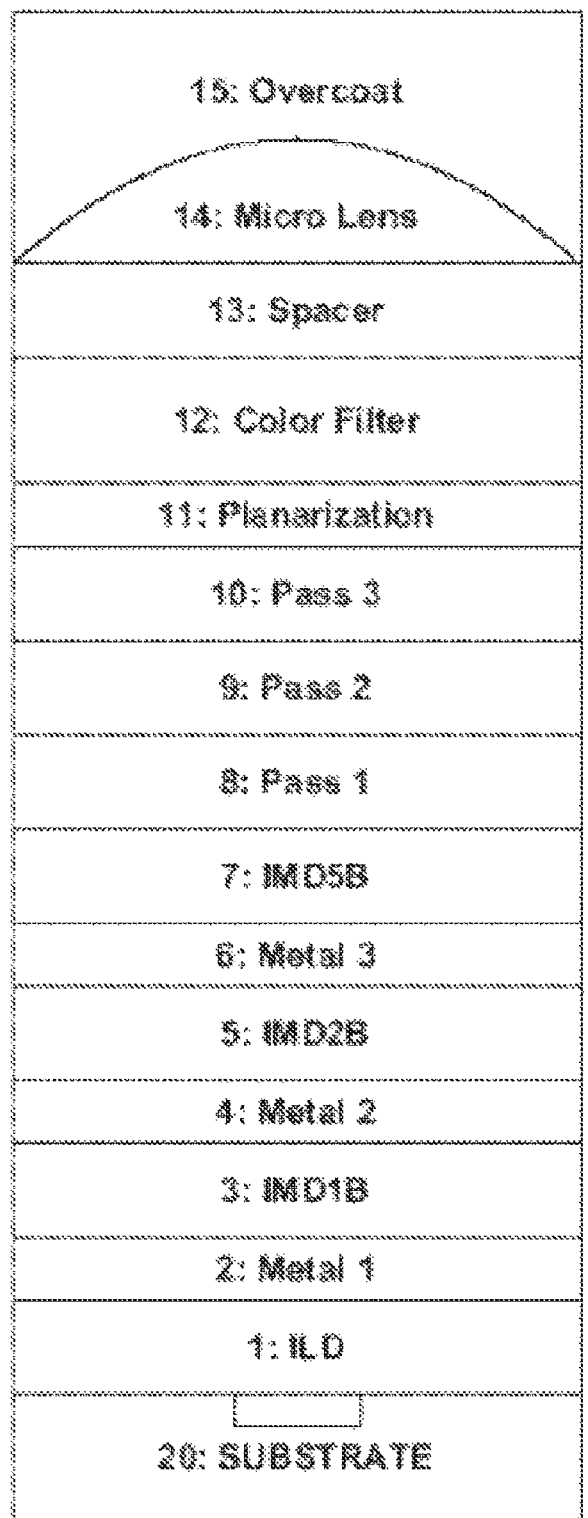
FIG. 1 shows a cross sectional view of a conventional image sensor.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

This disclosure is drawn, inter alia, to methods, apparatus, systems, and devices related to an image sensor and a compound pixel, which comprises a system of two pixels, each having two photodetectors and being capable of detecting two different range of wavelengths of light. An embodiment relates to a method for increasing the efficiency of an image sensor. Another embodiment provides a means for eliminating the color filter so that more than only one-third of the impinging light is use to produce an electrical signal. Another embodiment relates to a method for increasing the efficiency of an image sensor by increasing the amount of detected electromagnetic radiation impinging on the image sensor.

An embodiment relates to a device comprising an optical pipe comprising a core and a cladding, the optical pipe being configured to separate wavelengths of an electromagnetic radiation beam incident on the optical pipe at a selective wavelength through the core and the cladding, wherein the core is configured to be both a channel to transmit the wavelengths up to the selective wavelength and an active element to detect the wavelengths up to the selective wavelength transmitted through the core.

An optical pipe is an element to confine and transmit an electromagnetic radiation that impinges on the optical pipe. The optical pipe can include a core and a cladding.

A core and a cladding are complimentary components of the optical pipe and are configured to separate wavelengths of an electromagnetic radiation beam incident on the optical pipe at a selective wavelength through the core and cladding. An active element is any type of circuit component with the ability to electrically control electron and/or hole flow (electricity controlling electricity or light, or vice versa). Components incapable of controlling current by means of another electrical signal are called passive elements. Resistors, capacitors, inductors, transformers, and even diodes are all considered passive elements. Active elements include in embodiments disclosed herein, but are not limited to, an active waveguide, transistors, silicon-controlled rectifiers (SCRs), light emitting diodes, and photodiodes. A waveguide is a system or material designed to confine and direct electromagnetic radiation of selective wavelengths in a direction determined by its physical boundaries. Preferably, the selective wavelength is a function of the diameter of the waveguide. An active waveguide is a waveguide that has the ability to electrically control electron and/or hole flow (electricity controlling electricity or light, or vice versa). This ability of the active waveguide, for example, is one reason why the active waveguide could be considered to be "active" and within the genus of an active element.

An embodiment relates to methods to enhance the transmission of light to optically active devices on an integrated circuit (IC). An embodiment relates to methods for the generation of narrow vertical waveguides or waveguides with an angle to the IC surface or the active device. Other embodiments relate to nanowire growth from the IC or the optically active device as the core of the waveguide or as an active device itself, such as an active waveguide, a filter or a photodiode. An embodiment relates to waveguides produced by the methods such as advanced lithography and nanofabrication methods to generate vertical waveguides, filters, photodiodes on top of active optical devices or ICs.

Preferably, the device is configured to resolve black and white or luminescence information contained in the electromagnetic radiation by appropriate combinations of energies of the electromagnetic radiation detected in the core and the cladding.

In the embodiments disclosed herein, preferably, the core comprises a waveguide. Preferably, the active element is configured to be a photodiode, a charge storage capacitor, or combinations thereof. More preferably, the core comprises a waveguide comprising a semiconductor material. The device could further comprise a passivation layer around the waveguide in the core. The device could further comprise a metal layer around the waveguide in the core. The device could further comprise a metal layer around the passivation layer. Preferably, the device comprises no color or IR filter. Preferably, the optical pipe is circular, non-circular or conical. Preferably, the core has a core index of refraction ($n_1$), and the cladding has a cladding index of refraction ($n_2$), wherein $n_1 > n_2$ or $n_1 = n_2$.

In some embodiments, the device could further comprise at least a pair of metal contacts with at least one of the metal contacts being contacted to the waveguide. Preferably, the optical pipe is configured to separate wavelengths of an electromagnetic radiation beam incident on the optical pipe at a selective wavelength through the core and the cladding without requiring a color or IR filter. Preferably, the waveguide is configured to convert energy of the electromagnetic radiation transmitted through the waveguide and to generate electron hole pairs (excitons). Preferably, the waveguide comprises a PIN junction that is configured to detect the excitons generated in the waveguide.

In some embodiments, the device could further comprise an insulator layer around the waveguide in the core and a metal layer around the insulator layer to form a capacitor that is configured to collect the excitons generated in the waveguide and store charge. The could device further comprise metal contacts that connect to the metal layer and waveguide to control and detect the charge stored in the capacitor. Preferably, the cladding is configured to be a channel to transmit the wavelengths of the electromagnetic radiation beam that do not transmit through the core. Preferably, the cladding comprises a passive waveguide.

In some embodiments, the device could further comprise a peripheral photosensitive element, wherein the peripheral photosensitive element is operably coupled to the cladding. Preferably, an electromagnetic radiation beam receiving end of the optical pipe comprises a curved surface. Preferably, the peripheral photosensitive element is located on or within a substrate. Preferably, the core and the cladding are located on a substrate comprising an electronic circuit.

In some embodiments, the device could further comprise a lens structure or an optical coupler over the optical pipe, wherein the optical coupler is operably coupled to the optical pipe. Preferably, the optical coupler comprises a curved surface to channel the electromagnetic radiation into the optical pipe.

In some embodiments, the device could further comprise a stack surrounding the optical pipe, the stack comprising metallic layers embedded in dielectric layers, wherein the dielectric layers have a lower refractive index than that of the cladding. Preferably, a surface of the stack comprises a reflective surface. Preferably, the core comprises a first waveguide and the cladding comprises a second waveguide.

Other embodiments relate to a compound light detector comprising at least two different devices, each device comprising a optical pipe comprising a core and a cladding, the optical pipe being configured to separate wavelengths of an electromagnetic radiation beam incident on the optical pipe at a selective wavelength through the core and the cladding, wherein the core is configured to be both a channel to transmit the wavelengths up to the selective wavelength and an active element to detect the wavelengths up to the selective wavelength transmitted through the core, and the compound light detector is configured to reconstruct a spectrum of wavelengths of the electromagnetic radiation beam. Preferably, the core comprises a first waveguide having the selective wavelength such that electromagnetic radiation of wavelengths beyond the selective wavelength transmits through the cladding, further wherein the selective wavelength of the core of each of the at least two different devices is different such that the at least two different devices separate the electromagnetic radiation beam incident on the compound light detector at different selective wavelengths. Preferably, the cladding comprises a second waveguide that permits electromagnetic radiation of wavelengths beyond the selective wavelength to remains within the cladding and be transmitted to a peripheral photosensitive element. Preferably, a cross-sectional area of the cladding at an electromagnetic radiation beam emitting end of the cladding is substantially equal to an area of the peripheral photosensitive element. The compound light detector could further comprise a stack of metallic and non-metallic layers surrounding the optical pipe.

Preferably, the compound light detector is configured to detect energies of the electromagnetic radiation of four different ranges of wavelengths wherein the energies of the electromagnetic radiation of the four different ranges of wavelengths are combined to construct red, green and blue colors.

Other embodiments relate to a compound light detector comprising at least a first device and a second device, wherein the first device is configured to provide a first separation of an electromagnetic radiation beam incident on the optical pipe at a first selective wavelength without any filter, the second device is configured to provide a second separation of the electromagnetic radiation beam incident on the optical pipe at a second selective wavelength without any filter, the first selective wavelength is different from the second selective wavelength, each of the first device and the second device comprises a core that is configured to be both a channel to transmit the wavelengths up to the selective wavelength and an active element to detect the wavelengths up to the selective wavelength transmitted through the core, and the compound light detector is configured to reconstruct a spectrum of wavelengths of the electromagnetic radiation beam. Preferably, the two different devices comprise cores of different diameters. Preferably, the spectrum of wavelengths comprises wavelengths of visible light, IR or combinations thereof. Preferably, the first device comprises a core of a different diameter than that of the second device and the spectrum of wavelengths comprises wavelengths of visible light, IR or combinations thereof.

Preferably, the first device comprises a first waveguide having the first selective wavelength such that electromagnetic radiation of wavelength beyond the first selective wavelength will not be confined by the first waveguide, wherein the second device comprises a second waveguide having the second selective wavelength such that electromagnetic radiation of wavelength beyond the second selective wavelength will not be confined by the second waveguide, further wherein the first selective wavelength is different from the second selective wavelength. Preferably, the first device further comprises a first waveguide that permits electromagnetic radiation of wavelength of greater than the first selective wavelength to remains within the first waveguide and the second device further comprises a second waveguide that permits electromagnetic radiation of wavelength of greater than the second selective wavelength to remains within the second waveguide. Preferably, each of the first and second devices comprises a cladding comprising a photosensitive element. The compound light detector could further comprise a stack of metallic and non-metallic layers surrounding the first and second devices. Preferably, the first device comprises a core of a different diameter than that of the second device and the spectrum of wavelengths comprises wavelengths of visible light. Preferably, a plurality of light detectors are arranged on a square lattice, an hexagonal lattice, or in a different lattice arrangement.

In yet other embodiments, the lens structure or the optical coupler comprises a first opening and a second opening with the first opening being larger than the second opening, and a connecting surface extending between the first and second openings. Preferably, the connecting surface comprises a reflective surface.

In yet other embodiments, a plurality of light detectors are arranged on a regular tessellation.

Figure 2:
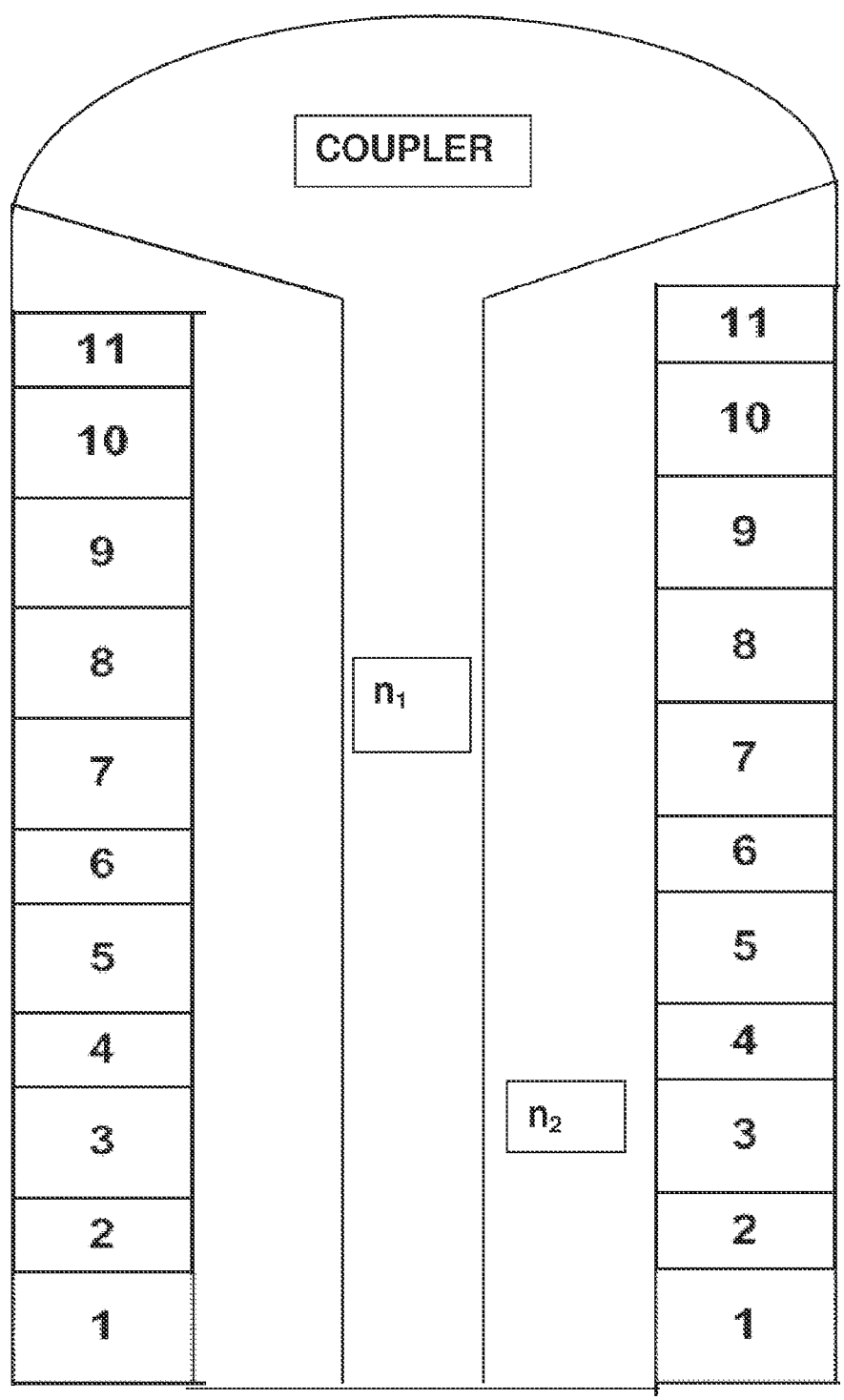
FIG. 2 shows a cross sectional view of an embodiment of an image sensor having a microlens.

In yet other embodiments, as shown in FIG. 2, a coupler that may take the shape of a micro lens efficiently could be located on the optical pipe to collect and guide the electromagnetic radiation into the optical pipe. As shown in FIG. 2, the optical pipe comprises of a nanowire core of refractive index $n_1$ surrounded by a cladding of refractive index $n_2$.

In the configuration of the optical pipe of FIG. 2, it is possible to eliminate pigmented color filters that absorb about ⅔ of the light that impinges on the image sensor. The core functions as an active waveguide and the cladding of the optical pipe could function as a passive waveguide with a peripheral photosensitive element surrounding the core to detect the electromagnetic radiation transmitted through the passive waveguide of the cladding. Passive waveguides do not absorb light like color filters, but can be designed to selectively transmit selected wavelengths. Preferably, the cross sectional area of the end of the cladding of the optical pipe adjacent to the peripheral photosensitive element in or on the substrate below the cladding is about the same size as the area of the peripheral photosensitive element.

A waveguide, whether passive or active, has a cutoff wavelength that is the lowest frequency that the waveguide can propagate. The diameter of the semiconductor waveguide of the core serves as the control parameter for the cutoff wavelength of the waveguide. In some embodiments, the optical pipe could be circular in or cross section so as to function as a circular waveguide characterized by the following parameters: (1) the core radius ($R_c$); (2) the core index of refraction ($n_1$); and (3) the cladding index of refraction ($n_2$). These parameters generally determine the wavelength of light that can propagate through the waveguide. A waveguide has a cutoff wavelength, $\lambda_{ct}$. The portion of the incident electromagnetic radiation having wavelengths longer than the cutoff wavelength would not be confined with the core. As a result, an optical pipe that functions as a waveguide whose cutoff wavelength is at green will not propagate red light though the core, and an optical pipe that functions as a waveguide whose cutoff wavelength is at blue will not propagate red and green light through the core.

In one implementation, a blue waveguide and a blue/green waveguide could be embedded within a white waveguide, which could be in the cladding. For example, any blue light could remain in the blue waveguide in a core, any blue or green light could remain in the green/blue waveguide of another core, and the remainder of the light could remain in the white waveguide in one or more the claddings.

The core could also serve as a photodiode by absorbing the confined light and generating electron hole pairs (excitons). As a result, an active waveguide in the core whose cutoff wavelength is at green will not propagate red light but and will also absorb the confined green light and generate excitons.

Excitons so generated can be detected by using at least one of the following two designs:

(1) A core is made up of a three layers, semiconductor, insulator and metal thus forming a capacitor to collect the charge generated by the light induced carriers. Contacts are made to the metal and to the semiconductor to control and detect the stored charge. The core could be formed by growing a nanowire and depositing an insulator layer and a metal layer surrounding the nanowire.

(2) A core having a PIN junction that induces a potential gradient in the core wire. The PIN junction in the core could be formed by growing a nanowire and doping the nanowire core while it is growing as a PIN junction and contacting it at the appropriate points using the various metal layers that are part of any device.

The photosensitive elements of the embodiments typically comprise a photodiode, although not limited to only a photodiode. Typically, the photodiode is doped to a concentration from about $1\times10^{16}$ to about $1\times10^{18}$ dopant atoms per cubic centimeter, while using an appropriate dopant.

The layers 1-11 in FIG. 2 illustrate different stacking layers similar to layers 1-11 of FIG. 1. The stacking layers comprise dielectric material-containing and metal-containing layers. The dielectric materials include as but not limited to oxides, nitrides and oxynitrides of silicon having a dielectric constant from about 4 to about 20, measured in vacuum. Also included, and also not limiting, are generally higher dielectric constant gate dielectric materials having a dielectric constant from about 20 to at least about 100. These higher dielectric constant dielectric materials may include, but are not limited to hafnium oxides, hafnium silicates, titanium oxides, barium-strontium titanates (BSTs) and lead-zirconate titanates (PZTs).

The dielectric material-containing layers may be formed using methods appropriate to their materials of composition. Non-limiting examples of methods include thermal or plasma oxidation or nitridation methods, chemical vapor deposition methods (including atomic layer chemical vapor deposition methods) and physical vapor deposition methods.

The metal-containing layers could function as electrodes. Non-limiting examples include certain metals, metal alloys, metal silicides and metal nitrides, as well as doped polysilicon materials (i.e., having a dopant concentration from about $1\times10^{18}$ to about $1\times10^{22}$ dopant atoms per cubic centimeter) and polycide (i.e., doped polysilicon/metal silicide stack) materials. The metal-containing layers may be deposited using any of several methods. Non-limiting examples include chemical vapor deposition methods (also including atomic layer chemical vapor deposition methods) and physical vapor deposition methods. The metal-containing layers could comprise a doped polysilicon material (having a thickness typically in the range 1000 to 1500 Angstrom The dielectric and metallization stack layer comprises a series of dielectric passivation layers. Also embedded within the stack layer are interconnected metallization layers. Components for the pair of interconnected metallization layers include, but are not limited to contact studs, interconnection layers, interconnection studs.

The individual metallization interconnection studs and metallization interconnection layers that could be used within the interconnected metallization layers may comprise any of several metallization materials that are conventional in the semiconductor fabrication art. Non-limiting examples include certain metals, metal alloys, metal nitrides and metal silicides. Most common are aluminum metallization materials and copper metallization materials, either of which often includes a barrier metallization material, as discussed in greater detail below. Types of metallization materials may differ as a function of size and location within a semiconductor structure. Smaller and lower-lying metallization features typically comprise copper containing conductor materials. Larger and upper-lying metallization features typically comprise aluminum containing conductor materials.

The series of dielectric passivation layers may also comprise any of several dielectric materials that are conventional in the semiconductor fabrication art. Included are generally higher dielectric constant dielectric materials having a dielectric constant from 4 to about 20. Non-limiting examples that are included within this group are oxides, nitrides and oxynitrides of silicon. For example, the series of dielectric layers may also comprise generally lower dielectric constant dielectric materials having a dielectric constant from about 2 to about 4. Included but not limiting within this group are hydrogels such as silicon hydrogel, aerogels like silicon Al, or carbon aerogel, silsesquioxane spin-on-glass dielectric materials, fluorinated glass materials, organic polymer materials, and other low dielectric constant materials such as doped silicon dioxide (e.g., doped with carbon, fluorine), and porous silicon dioxide.

Typically, the dielectric and metallization stack layer comprises interconnected metallization layers and discrete metallization layers comprising at least one of copper metallization materials and aluminum metallization materials. The dielectric and metallization stack layer also comprises dielectric passivation layers that also comprise at least one of the generally lower dielectric constant dielectric materials disclosed above. The dielectric and metallization stack layer could have an overall thickness from about 1 to about 4 microns. It may comprise from about 2 to about 4 discrete horizontal dielectric and metallization component layers within a stack.

The layers of the stack layer could be patterned to form patterned dielectric and metallization stack layer using methods and materials that are conventional in the semiconductor fabrication art, and appropriate to the materials from which are formed the series of dielectric passivation layers. The dielectric and metallization stack layer may not be patterned at a location that includes a metallization feature located completely therein. The dielectric and metallization stack layer may be patterned using wet chemical etch methods, dry plasma etch methods or aggregate methods thereof. Dry plasma etch methods as well as e-beam etching if the dimension needs to be very small, are generally preferred insofar as they provide enhanced sidewall profile control when forming the series of patterned dielectric and metallization stack layer.

The planarizing layer 11 may comprise any of several optically transparent planarizing materials. Non-limiting examples include spin-on-glass planarizing materials and organic polymer planarizing materials. The planarizing layer 11 could extend above the optical pipe such that the planarizing layer 11 would have a thickness sufficient to at least planarize the opening of the optical pipe, thus providing a planar surface for fabrication of additional structures within the CMOS image sensor. The planarizing layer could be patterned to form the patterned planarizing layer.

Optionally, there could be a series of color filter layers 12 located upon the patterned planarizing layer 11. The series of color filter layers, if present, would typically include either the primary colors of red, green and blue, or the complementary colors of yellow, cyan and magenta. The series of color filter layers would typically comprise a series of dyed or pigmented patterned photoresist layers that are intrinsically imaged to form the series of color filter layers. Alternatively, the series of color filter layers may comprise dyed or pigmented organic polymer materials that are otherwise optically transparent, but extrinsically imaged while using an appropriate mask layer. Alternative color filter materials may also be used. The filter could also be filter for a black and white, or IR sensors wherein the filter cuts off visible and pass IR predominantly.

The spacer layer (13) could be one or more layers made of any material that physically, but not optically, separates the stacking layers from the micro lens (14). The spacer layer could be formed of a dielectric spacer material or a laminate of dielectric spacer materials, although spacer layers formed of conductor materials are also known. Oxides, nitrides and oxynitrides of silicon are commonly used as dielectric spacer materials. Oxides, nitrides and oxynitrides of other elements are not excluded. The dielectric spacer materials may be deposited using methods analogous, equivalent or identical to the methods described above. The spacer layer could be formed using a blanket layer deposition and etchback method that provides the spacer layer with the characteristic inward pointed shape.

The micro lens (14) may comprise any of several optically transparent lens materials that are known in the art. Non-limiting examples include optically transparent inorganic materials, optically transparent organic materials and optically transparent composite materials. Most common are optically transparent organic materials. Typically the lens layers could be formed incident to patterning and reflow of an organic polymer material that has a glass transition temperature lower than the series of color filter layers 12, if present, or the patterned planarizing layer 11.

In the optical pipe, the high index material in the core could, for example, be silicon nitride having a refractive index of about 2.0. The lower index cladding layer material could, for example, be a glass, for example a material selected from Table II, having a refractive index about 1.5.

TABLE II

| Typical Material Index of Refraction | |
|---|---|
| Micro Lens (Polymer) | 1.583 |
| Spacer | 1.512 |
| Color Filter | 1.541 |
| Planarization | 1.512 |
| PESiN | 2.00 |
| PESiO | 1.46 |
| SiO | 1.46 |

In Table II, PESiN refers to plasma enhanced SiN and PESiO refers to plasma enhanced SiO.

Optionally, a micro lens could be located on the optical pipe near the incident electromagnetic radiation beam receiving end of the image sensor. The function of the micro lens or in more general terms is to be a coupler, i.e., to couple the incident electromagnetic radiation beam into the optical pipe. If one were to choose a micro lens as the coupler in this embodiment, its distance from the optical pipe would be much shorter than to the photosensitive element, so the constraints on its curvature are much less stringent, thereby making it implementable with existing fabrication technology.

The shape of the optical pipe could be different for different embodiments. In one configuration, the optical pipe could cylindrical, that is, the diameter of the pipe remains the substantially the same throughout the length of the optical pipe. In another configuration, the optical pipe could conical, where the upper diameter of the cross sectional area of the optical pipe could be greater or smaller than the lower diameter of the cross sectional area of the optical pipe. The terms "upper" and "lower" refer to the ends of the optical pipe located closer to the incident electromagnetic radiation beam receiving and exiting ends of the image sensor. Other shapes include a stack of conical sections.

Table II lists several different glasses and their refractive indices. These glasses could be used for the manufacture of the optical pipe such that refractive index of the core is higher than that of the cladding. The image sensors of the embodiments could be fabricated using different transparent glasses having different refractive indices without the use of pigmented color filters.

By nesting optical pipes that function as waveguides and using a micro lens coupler as shown in FIG. 2, an array of image sensors could be configured to obtain complementary colors having wavelengths of electromagnetic radiation separated at a cutoff wavelength in the core and cladding of each optical pipe of every image sensor. The complementary colors are generally two colors when mixed in the proper proportion produce a neutral color (grey, white, or black). This configuration also enables the capture and guiding of most of the electromagnetic radiation incident beam impinging on the micro lens to the photosensitive elements (i.e., photodiodes) located at the lower end of the optical pipe. Two adjacent or substantially adjacent image sensors with different color complementary separation can provide complete information to reconstruct a full color scene according to embodiments described herein. This technology of embodiments disclosed herein can further supplant pigment based color reconstruction for image sensing which suffers from the inefficiency of discarding (through absorption) the non selected color for each pixel.

Each physical pixel of a device containing an image sensor of the embodiments disclosed herein would have two outputs representing the complementary colors, e.g., cyan (or red) designated as output type 1 and yellow (or blue) designated as output type 2. These outputs would be arranged as follows:

```
1 2 1 2 1 2 1 2 1 2 1 2 1 2 1 2 . . .
2 1 2 1 2 1 2 1 2 1 2 1 2 1 2 1 . . .
1 2 1 2 1 2 1 2 1 2 1 2 1 2 1 2 . . .
             . . .
             . . .
```

Each physical pixel would have complete luminance information obtained by combining its two complementary outputs. As a result, the same image sensor can be used either as a full resolution black and white or full color sensor.

In the embodiments of the image sensors disclosed herein, the full spectrum of wavelengths of the incident electromagnetic radiation beam (e.g., the full color information of the incident light) could be obtained by the appropriate combination of two adjacent pixels either horizontally or vertically as opposed to 4 pixels for the conventional Bayer pattern.

Depending on minimum transistor sizes, each pixel containing an image sensor of the embodiments disclosed herein could be as small as 1 micron or less in pitch and yet have sufficient sensitivity. This could open the way for contact imaging of very small structures such as biological systems.

The embodiments, which include a plurality of embodiments of an image sensor, as well as methods for fabrication thereof, will be described in further detail within the context of the following description. The description is further understood within the context of the drawings described above. The drawings are for illustrative purposes and as such are not necessarily drawn to scale.

An embodiment of a compound pixel comprises a system of two pixels, each having a core of a different diameter such that cores have diameters $d_1$ and $d_2$ for directing light of different wavelengths ($\lambda_B$ and $\lambda_R$). The two cores also serve as photodiodes to capture light of wavelengths $\lambda_B$ and $\lambda_R$. The claddings of the two image sensors serve for transmitting the light of wave length $\lambda_{w-B}$ and $\lambda_{w-R}$. The light of wave length $\lambda_{w-B}$ and $\lambda_{w-R}$ transmitted through the cladding is detected by the peripheral photosensitive elements surrounding the cores. Note that (w) refers to the wavelength of white light. Signals from the 4 photodiodes (two located in the cores and two located in or on the substrate surrounding the core) in the compound pixel are used to construct color.

The embodiments include a nanostructured photodiode (PD) according to the embodiments comprise a substrate and an upstanding nanowire protruding from the substrate. A pn-junction giving an active region to detect light may be present within the structure. The nanowire, a part of the nanowire, or a structure in connection with the nanowire, forms a waveguide directing and detecting at least a portion of the light that impinges on the device. In addition the waveguide doubles up as spectral filter that enables the determination of the color range of the impinging light.

The waveguiding properties of the optical pipe of the embodiments can be improved in different ways. The waveguide core has a first effective refractive index, $n_1$ (also referred as $n_w$ below), and the material in the cladding surrounding at least a portion of the waveguide has a second effective refractive index, $n_2$ (also referred as $n_c$ below), and by assuring that the first refractive index is larger than the second refractive index, $n_1 > n_2$, good wave-guiding properties are provided to the optical pipe. The waveguiding properties may be further improved by introducing optically active cladding layers on the waveguide core. The nanowire core is used as a waveguide, and also as a nanostructured PD which may also be an active capacitor. The nanostructured PD according to the embodiments is well suited for mass production, and the method described is scaleable for industrial use.

The nanowire technology offers possibilities in choices of materials and material combinations not possible in conventional bulk layer techniques. This is utilised in the nanostructured PD according to the embodiments to provide PDs detecting light in well defined wavelength regions not possible by conventional technique, for example blue, cyan or white. The design according to the embodiments allows for inclusions of heterostructures as well as areas of different doping within the nanowire, facilitating optimization of electrical and/or optical properties.

A nanostructured PD according to the embodiments comprises of an upstanding nanowire. For the purpose of this application an upstanding nanowire should be interpreted as a nanowire protruding from the substrate in some angle, the upstanding nanowire for example being grown from the substrate, preferably by as vapor-liquid-solid (VLS) grown nanowires. The angle with the substrate will typically be a result of the materials in the substrate and the nanowire, the surface of the substrate and growth conditions. By controlling these parameters it is possible to produce nanowires pointing in only one direction, for example vertical, or in a limited set of directions. For example nanowires and substrates of zinc-blende and diamond semiconductors composed of elements from columns III, V and IV of the periodic table, such nanowires can be grown in the [111] directions and then be grown in the normal direction to any {111} substrate surface. Other directions given as the angle between normal to the surface and the axial direction of the nanowire include 70.53° {111}, 54.73° {100}, and 35.27° and 90°, both to {110}. Thus the nanowires define one, or a limited set, of directions.

According to the embodiments, a part of the nanowire or structure formed from the nanowire is used as a waveguide directing and confining at least a portion of the light impinging on the nanostructured PD in a direction given by the upstanding nanowire. The ideal waveguiding nanostructured PD structure includes a high refractive index core with one or more surrounding cladding with refractive indices less than that of the core. The structure is either circular symmetrical or close to being circular symmetrical. Light waveguiding in circular symmetrical structures are well know for fiber-optic applications and many parallels can be made to the area of rare-earth-doped fiber optic devices. However, one difference is that fiber amplifier are optically pumped to enhance the light guided through them while the described nanostructured PD can be seen as an efficient light to electricity converter. One well known figure of merit is the so called Numerical Aperture, NA. The NA determines the angle of light captured by the waveguide. The NA and angle of captured light is an important parameter in the optimization of a new PD structure.

For a PD operating in IR and above IR, using GaAs is good, but for a PD operating in the visible light region, silicon would be preferable. For example to create circuits, Si and doped Si materials are preferable. Similarly, for a PD working in the visible range of light, one would prefer to use Si.

In one embodiment, the typical values of the refractive indexes for III-V semiconductor core material are in the range from 2.5 to 5.5 when combined with glass type of cladding material (such as $SiO_2$ or $Si_3N_4$) having refractive indexes ranging from 1.4 to 2.3. A larger angle of capture means light impinging at larger angles can be coupled into the waveguide for better capture efficiency.

One consideration in the optimization of light capture is to provide a coupler into the nanowire structure to optimize light capture into the structure. In general, it would be preferred to have the NA be highest where the light collection takes place. This would maximize the light captured and guided into the PD.

A nanostructured PD according to the embodiments is schematically illustrated in FIG. 2 and comprises a substrate and a nanowire epitaxially grown from the substrate in an defined angle θ. A portion of or all of the nanowire could be arranged to act as a waveguiding portion directing at least a portion of the impinging light in a direction given by the elongated direction of the nanowire, and will be referred to as a waveguide. In one possible implementation, a pn-junction necessary for the diode functionality is formed by varying the doping of the wire along its length while it is growing. Two contact could be provided on the nanowire for example one on top or in a wrapping configuration on the circumferential outer surface (depicted) and the other contact could be provided in the substrate. The substrate and part of the upstanding structure may be covered by a cover layer, for example as a thin film as illustrated or as material filling the space surrounding the nanostructured PD.

The nanowire typically has a diameter in the order of 50 nm to 500 nm, The length of the nanowire is typically and preferably in the order of 1 to 10 μm. The pn-junction results in an active region arranged in the nanowire. Impinging photons in the nanowire are converted to electron hole pairs and in one implementation are subsequently separated by the electric fields generated by the PN junction along the length of the nanowire. The materials of the different members of the nanostructured PD are chosen so that the nanowire will have good waveguiding properties vis-a-vis the surrounding materials, i.e. the refractive index of the material in the nanowire should preferably be larger than the refractive indices of the surrounding materials.

In addition, the nanowire may be provided with one or more layers. A first layer, may be introduced to improve the surface properties (i.e., reduce charge leakage) of the nanowire. Further layers, for example an optical layer may be introduced specifically to improve the waveguiding properties of the nanowire, in manners similar to what is well established in the area of fiber optics. The optical layer typically has a refractive index in between the refractive index of the nanowire and the surrounding cladding region material. Alternatively the intermediate layer has a graded refractive index, which has been shown to improve light transmission in certain cases. If an optical layer is utilised the refractive index of the nanowire, $n_w$, should define an effective refractive index for both the nanowire and the layers.

The ability to grow nanowires with well defined diameters, as described above and exemplified below, is in one embodiment utilised to optimize the waveguiding properties of the nanowire or at least the waveguide with regards to the wavelength of the light confined and converted by the nanostructured PD. In the embodiment, the diameter of the nanowire is chosen so as to have a favorable correspondence to the wavelength of the desired light. Preferably the dimensions of the nanowire are such that a uniform optical cavity, optimized for the specific wavelength of the produced light, is provided along the nanowire. The core nanowire must be sufficiently wide to capture the desired light. A rule of thumb would be that diameter must be larger than $\lambda/2n_w$, wherein $\lambda$ is the wavelength of the desired light and $n_w$ is the refractive index of the nanowire. As an example a diameter of about 60 nm may be appropriate to confine blue light only and one 80 nm may be appropriate for to confine both blue and green light only in a silicon nanowire.

In the infra-red and near infra-red a diameter above 100 nm would be sufficient. An approximate preferred upper limit for the diameter of the nanowire is given by the growth constrains, and is in the order of 500 nm. The length of the nanowire is typically and preferably in the order of 1-10 μm, providing enough volume for the light conversion region A reflective layer is in one embodiment, provided on the substrate and extending under the wire. The purpose of the reflective layer is to reflect light that is guided by the wire but has not been absorbed and converted to carriers in the nanostructured PD. The reflective layer is preferably provided in the form of a multilayered structure comprising repeated layers of silicates for example, or as a metal film. If the diameter of the nanowire is sufficiently smaller than the wavelength of the light a large fraction of the directed light mode will extend outside the waveguide, enabling efficient reflection by a reflective layer surrounding the narrow the nanowire waveguide An alternative approach to getting a reflection in the lower end of the waveguide core is to arrange a reflective layer in the substrate underneath the nanowire. Yet another alternative is to introduce reflective means within the waveguide. Such reflective means can be a multilayered structure provided during the growth process of the nanowire, the multilayered structure comprising repeated layers of for example $SiN_x$/$SiO_x$ (dielectric).

The previous depicted cylindrical volume element which is achievable with the referred methods of growing nanowires, should be seen as an exemplary shape. Other geometries that are plausible include, but is not limited to a cylindrical bulb with a dome-shaped top, a spherical/ellipsoidal, and pyramidal.

To form the pn-junction necessary for light detection at least part of the nanostructure is preferably doped. This is done by either changing dopants during the growth of the nanowire or using a radial shallow implant method on the nanowire once it is grown.

Considering systems where nanowire growth is locally enhanced by a substance, as vapor-liquid-solid (VLS) grown nanowires, the ability to alter between radial and axial growth by altering growth conditions enables the procedure (nanowire growth, mask formation, and subsequent selective growth) can be repeated to form nanowire/3D-sequences of higher order. For systems where nanowire growth and selective growth are not distinguished by separate growth conditions it may be better to first grow the nanowire along the length and by different selective growth steps grow different types of 3D regions.

A fabrication method according to the present embodiments in order to fabricate a light detecting pn-diode/array with active nanowire region(s) formed of Si, comprises the steps of:
1. Defining of local catalyst/catalysts on a silicon substrate by lithography.
2. Growing silicon nanowire from local catalyst. The growth parameters adjusted for catalytic wire growth.
3. Radial growing of other semiconductor, passivation, thin insulator or metal concentric layer around the nanowire (cladding layer).
4. Forming contacts on the PD nanowire and to the substrate and to other metal layers in a CMOS circuit.

The growth process can be varied in known ways, for example, to include heterostructures in the nanowires, provide reflective layers etc.

Depending on the intended use of the nanostructured PD, availability of suitable production processes, costs for materials etc., a wide range of materials can be used for the different parts of the structure. In addition, the nanowire based technology allows for defect free combinations of materials that otherwise would be impossible to combine. The III-V semiconductors are of particular interest due to their properties facilitating high speed and low power electronics. Suitable materials for the substrate include, but is not limited to: Si, GaAs, GaP, GaP:Zn, GaAs, InAs, InP, GaN, $Al_2O_3$, SiC, Ge, GaSb, ZnO, InSb, SOI (silicon-on-insulator), CdS, ZnSe, CdTe. Suitable materials for the nanowire 110 include, but is not limited to: Si, GaAs (p), InAs, Ge, ZnO, InN, GaInN, GaN AlGaInN, BN, InP, InAsP, GaInP, InGaP:Si, InGaP:Zn, GaInAs, AlInP, GaAlInP, GaAlInAsP, GaInSb, InSb. Possible donor dopants for e.g. GaP, Te, Se, S, etc, and acceptor dopants for the same material are Zn, Fe, Mg, Be, Cd, etc. It should be noted that the nanowire technology makes it possible to use nitrides such as SiN, GaN, InN and AN, which facilitates fabrication of PDs detecting light in wavelength regions not easily accessible by conventional technique.

Other combinations of particular commercial interest include, but is not limited to GaAs, GaInP, GaAlInP, GaP systems. Typical doping levels range from $10^{18}$ to $10^{20}$ A person skilled in the art is though familiar with these and other materials and realizes that other materials and material combinations are possible.

The appropriateness of low resistivity contact materials are dependent on the material to be deposited on, but metal, metal alloys as well as non-metal compounds like Al, Al—Si, $TiSi_2$, TiN, W, $MoSi_2$, PtSi, $CoSi_2$, $WSi_2$, In, AuGa, AuSb, AuGe, PdGe, Ti/Pt/Au, Ti/Al/Ti/Au, Pd/Au, ITO (InSnO), etc. and combinations of e.g. metal and ITO can be used.

The substrate is an integral part of the device, since it also contains the photodiodes necessary to detect light that has not been confined to the nanowire. The substrate in addition also contains standard CMOS circuits to control the biasing, amplification and readout of the PD as well as any other CMOS circuit deemed necessary and useful. The substrate include substrates having active devices therein. Suitable materials for the substrates include silicon and silicon-containing materials. Generally, each sensor element of the embodiments include a nanostructured PD structure comprise a nanowire, a cladding enclosing at least a portion of the nanowire, a coupler and two contacts.

The fabrication of the nanostructured PDs on silicon is possible to the degree that the nanowires are uniformly aligned the (111) direction normal to the substrates and essentially no nanowires are grown in the three declined (111) directions that also extends out from the substrate. The well aligned growth of III-V nanowires in predefined array structures on silicon substrates, is preferred for successful large scale fabrication of optical devices, as well as most other applications.

PD devices build on silicon nanowires are of high commercial interest due to their ability to detect light of selected wavelengths not possible with other material combinations. In addition they allow the design of a compound photodiode that allows the detection of most of the light that impinges on a image sensor.

The fabrication of the image sensor of the embodiments disclosed herein is described in the Examples below with reference to figures shown herein.

Example 1

Capacitor Surrounding Nanowire

The embodiments of Example 1 relate to the manufacture of an optical pipe comprising a core and a cladding.

The core is made up of three layers, a semiconductor nanowire, an insulator and metal thus forming a capacitor to collect the charge generated by the light induced carriers in the nanowire. Contacts are made to the metal and to the semiconductor nanowire to control and detect the stored charge. The core of the embodiments of Example 1 functions as a waveguide and a photodiode. The cladding of the embodiments of Example 1 comprises a peripheral waveguide and a peripheral photodiode located in or on the silicon substrate of the optical sensor.

Figures 1, 3:
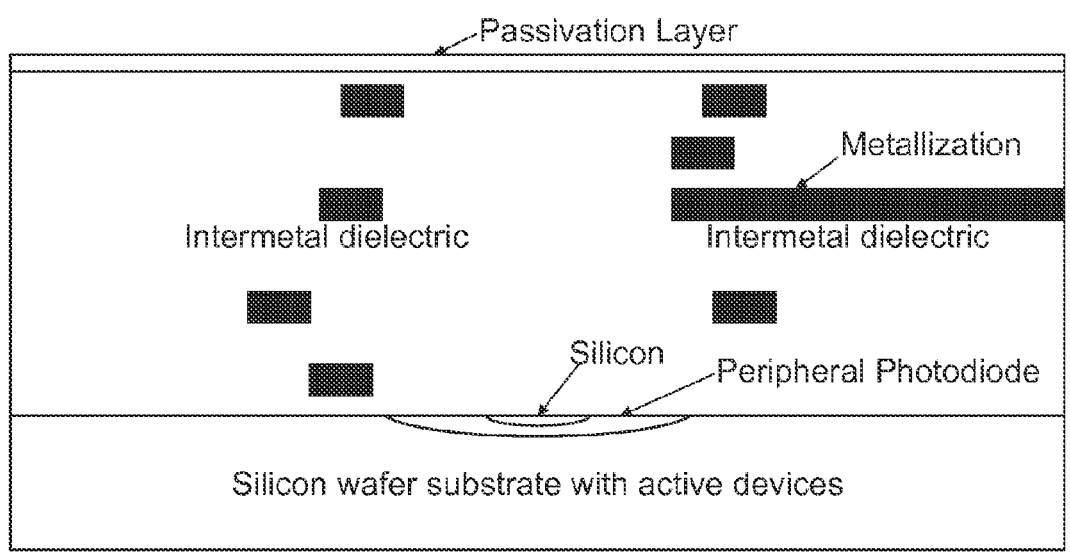
Figures 2, 3:
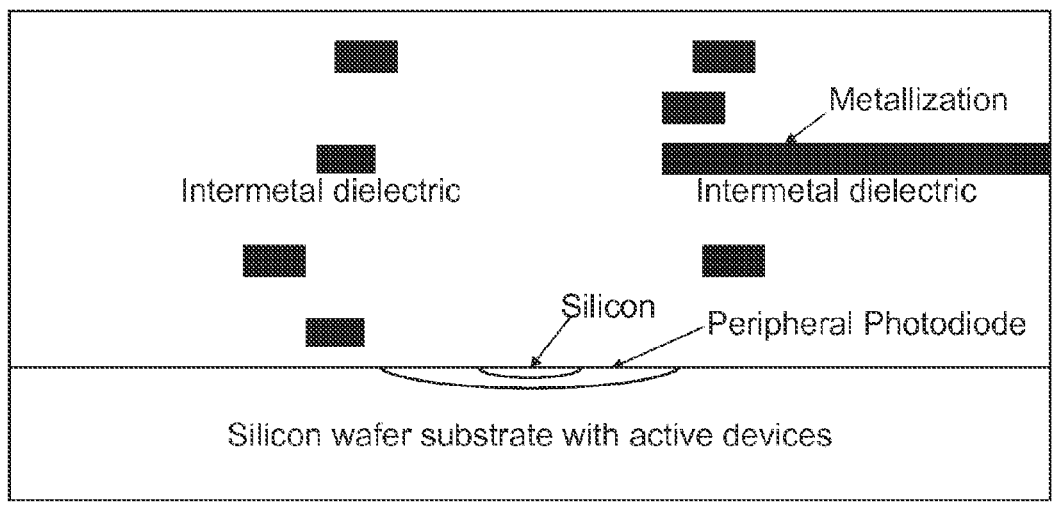
Figure 3:
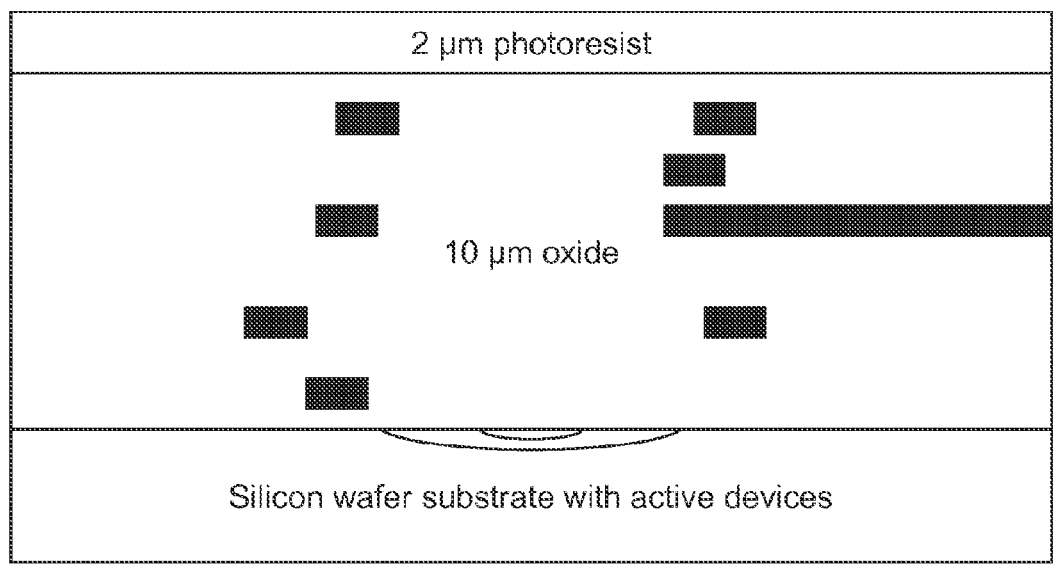

The fabrication of a pixel of the optical sensor is shown in FIGS. 3-1 to 3-23. FIG. 3-1 shows an integrated circuit (IC) having an optical device in the substrate. The optical include a peripheral photodiode. The IC of FIG. 3-1 comprises a silicon wafer substrate optionally having active devices therein, a peripheral photodiode in or on the silicon wafer, a silicon-containing spot in or on the peripheral photodiode, stacking layers containing metallization layers and intermetal dielectric layers, and a passivation layer. The thickness of the stacking layers is generally around 10 µm. The method of manufacturing the IC of FIG. 3-1 by planar deposition techniques is well-known to persons of ordinary skill in the art. The IC of FIG. 3-1 could be starting point for the manufacture of the embodiments of Example 1.

Starting from the IC shown in FIG. 3-1, steps for the manufacture of the embodiments of Example 1 could be as follows:

Applying approximately 2 µm thick photoresist with 1:10 etch ratio (FIG. 3-3).

Exposing the photoresist to ultraviolet (UV) light, developing the photoresist, post-baking the photoresist, and etching the photoresist to create an opening above the peripheral photodiode (FIG. 3.4).

Figures 3, 4:
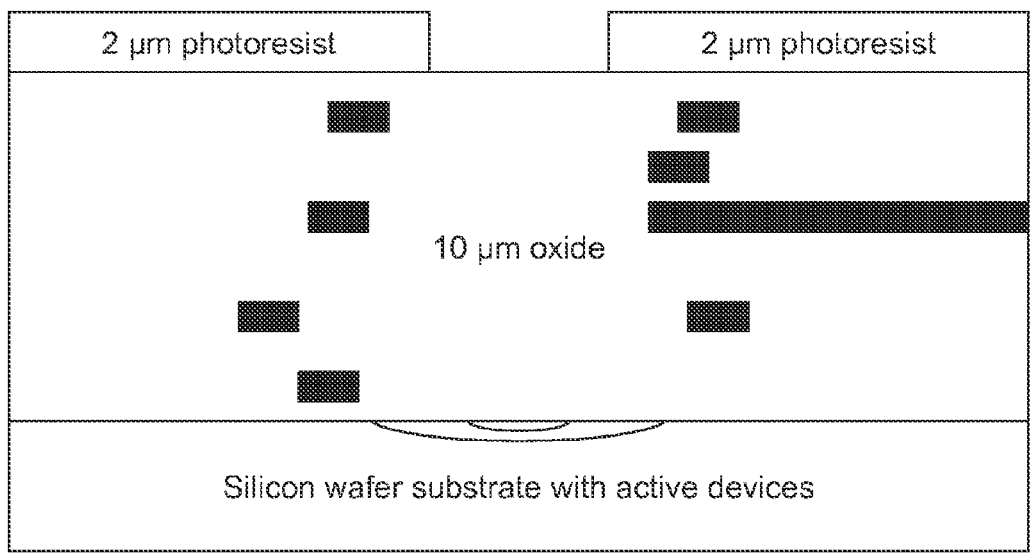
Figures 3, 4, 5:
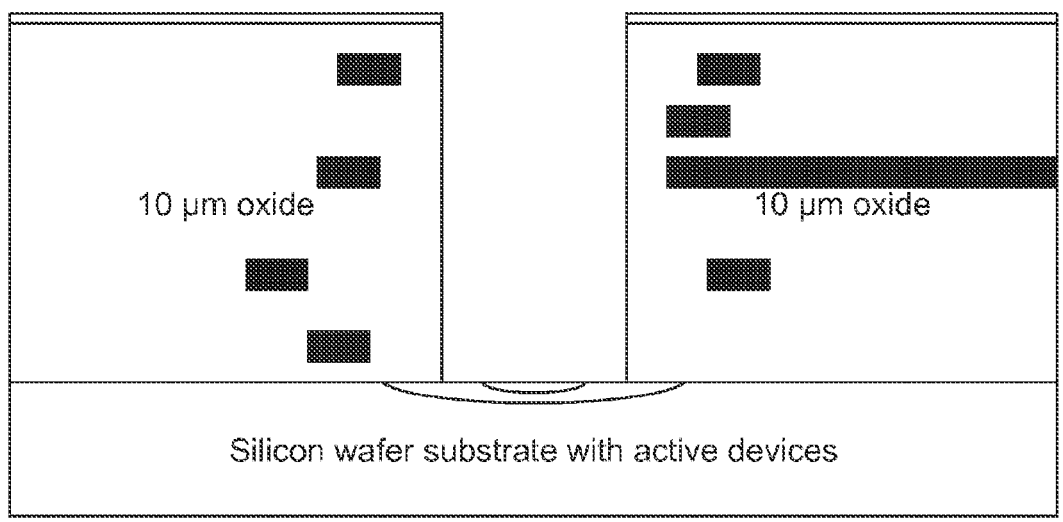

Etching the dielectric layers in the stacking layers over the peripheral photodiode by deep reactive ion etch (RIE) to form a deep cavity in the stacking layers, wherein the deep cavity extends up to the peripheral photodiode in or on the silicon wafer substrate (FIG. 3-5).

Removing the photoresist above the stacking layers (FIG. 3-6).

Depositing a metal such a copper in the vertical walls of the deep cavity (FIG. 3-7).

Applying e-beam resist on the top surface of the stacking layers and on the metal layer on the vertical walls of the deep cavity (FIG. 3-8).

Removing the e-beam resist at a location on the silicon-containing spot on or in the peripheral diode to form an opening in the e-beam resist located on the silicon-containing spot (FIG. 3-9).

Applying gold layer by sputtering or evaporating gold on the surface of the e-beam resist and the opening in the e-beam photoresist (FIG. 3-10).

Forming a gold particle by lifting off the e-beam photoresist and gold, thereby leaving a gold particle in the opening in the e-beam resist (FIG. 3-11). Note that the thickness and diameter of the gold particle left behind in the deep cavity determines the diameter of the nanowire.

Growing a silicon nanowire by plasma enhanced vapor-liquid-solid growth (FIG. 3-12). Suitable methods for growing nanowires on semiconductor substrates in general are described in WO2008079076A1 and U.S. Patent Publication 20080248304, 20080246123, 20080246020, and 20080237568. Methods of providing epitaxially grown nanowires with heterostructures are to be found in U.S. Patent Publication 20040075464. Additional discussion for the growth of silicon nanowire can be found in "Growth of Single Crystal Silicon Nanowires in Supercritical Solution from Tethered Gold Particles on a Silicon Substrate" by Lu et al., NanoLetters, 2003, Vol. 3, No. 1, pages 93-99, particularly the first four paragraphs, the entire disclosure of which is incorporated herein by reference. U.S. Patent Publication 2002/0172820 to Majumdar et al. (published Nov. 21, 2002) discloses nanowires. In addition, the following references can be used as guide to practicing the embodiments disclosed herein: (1) Madou, Fundamentals of Microfabrication, 2nd Ed., CRC Press, 2002 (for example, the properties and growth of silicon, including crystalline silicon, are described at pages 125-204); (2) "Control of Thickness and Orientation of Solution-Grown Silicon Nanowires"; Holmes et al., Science, Vol. 287, Feb. 25, 2000, pages 1471-1473 (this reference discloses bulk quantities of defect-free silicon nanowires with nearly uniform diameters ranging from 40-50 angstroms grown to several micrometers with a supercritical fluid solution-phase approach); (3) "A Laser Ablation Method for the Synthesis of Crystalline Semiconductor Nanowires"; Morales et al., Science, Vol. 279, Jan. 9, 1998, pages 208-211; (4) "Nucleation and Growth of Germanium Nanowires Seeded by Organic Monolayer-Coated Gold Nanocrystals"; Hanrath et al.; J. Am. Chem. Soc., Vol. 124, No. 7, 2002, pages 1424-1429; (5) U.S. Patent publication, 2003/0003300 A1 published Jan. 2, 2003 to Korgel and Johnston, in particular, describing supercritical fluid processes and use of organic silicon precursors to form silicon nanoparticles; and (6) "Supercritical Fluid-Liquid-Solid (SFLS) Synthesis of Si and Ge Nanowires Seeded by Colloidal Metal Nanocrystals," Hanrath, T. et al., Advanced Materials, 2003, 15, No. 5, Mar. 4, pages 437-440. The above mentioned references are incorporated herein in their entirety by reference.

The silicon nanowire of the embodiments disclosed herein could be made as follows. A substrate is provided which comprises silicon having a silicon dioxide surface. The surface can be modified with a surface treatment to promote adsorption of a gold nanoparticle. Onto this modified surface, the gold nanoparticle can be formed by deposition of a gold layer (FIG. 3-10), followed by removal of the gold layer over regions other than desired location of the gold nanoparticle (FIG. 3-11). The gold nanoparticle can be surface treated to provide for steric stabilization. In other words, tethered, sterically stabilized gold nanoparticles can be used as seeds for further synthesis of nanowires, wherein the gold nanoparticles are adsorbed to the modified silicon substrate. The degradation of diphenyl silane (DPS) to forms silicon atoms. These silicon atoms are introduced into the deep cavity in the stacking layers of the IC shown in FIG. 3-11. The silicon atoms attach to the gold nanoparticle and a silicon nanowire crystallizes from the gold nanoparticle seed upon saturation of the gold nanoparticle with silicon atoms (FIG. 3-12).

Forming a conformal dielectric coating by chemical vapor deposition (CVD), atomic layer deposition (ALD), oxidation or nitration (FIG. 3-13).

Depositing doped glass by plasma enhanced chemical vapor deposition, spin-on coating, sputtering, optionally with an initial atomic layer deposition (FIG. 3-14).

Etching back the deposited doped glass by chemical-mechanical planarization or other methods of etching (FIG. 3-15).

FIGS. 3-16 to 2-23 relate to generating a funnel and a lens on the funnel to channel electromagnetic radiation such as light into the nanowire waveguide. The steps are as follows:

Deposition of a glass/oxide/dielectric layer by CVD, sputter deposition or spin-on coating (FIG. 3-16).

Application of a photoresist on the deposited glass/oxide/dielectric layer (FIG. 3-17).

Removal of the photoresist outside the opening centered over the nanowire within the deep cavity (FIG. 3-18).

Forming a coupler by semi-isotropic etching in the glass/oxide/dielectric layer (FIG. 3-19).

Example 2

PIN or PN Photodiode in Nanowire

The embodiments of Example 1 relate to the manufacture of an optical pipe comprising a core and a cladding.

The core has a PN or PIN junction that induces a potential gradient in the core wire. The PN or PIN junction in the core could be formed by growing a nanowire and doping the nanowire core while it is growing as a PIN junction. For example, the doping of the nanowire could have two levels of doping to form N and P, or in other embodiments, the nanowire could comprise P, I and N regions to form a PIN photodiode. Yet, another possibility is doping the wire along its length in concentric circles to form P and N or P, I and N regions to form a PN or PIN photodiode. The PN or PIN junction nanowire (also referred to as a PN or PIN photodiode) is contacted at the appropriate points along PN or PIN junction nanowire using the various metal layers that are part of any device to detect the charge generated by the light induced carriers in the PN or PIN junction nanowire. The cladding of the embodiments of Example 2 comprises a peripheral waveguide and a peripheral photodiode located in or on the silicon substrate of the optical sensor.

The method of making the embodiments of Example 2 is similar in many ways to the method of making the embodiments of Example 1. For the sake of conciseness, the method of making the embodiments of Example 2 is described below with reference to FIGS. 3-1 to 3-23.

The steps shown in FIGS. 3-1 to 3-6 of Example 1 are carried out.

The step of depositing a metal in vertical cavity walls shown in FIG. 3-7 of Example 1 is omitted.

Subsequently, the steps shown in FIGS. 3-8 to 3-11 of Example 1 are carried out.

Next a modified version of the nanowire growth step of Example 1 is carried out. The method of crystallizing a nanowire using a gold nanoparticle as a catalyst would be similar to that of Example 1. However, in Example 1, the nanowire grown in the step shown in FIG. 3-12 comprises substantially the same material though out the nanowire. On the other hand, in Example 2, the nanowire growth step shown in FIG. 3-12 of Example 1 is substituted by the step of growing a nanowire having two or more different doped regions to form a PN photodiode (FIG. 4) by growing a N-doped (n-doped) nanowire followed by growing a P-doped (p-doped) nanowire or a PIN photodiode (FIG. 5) by first growing a N-doped (n-doped) nanowire, then growing an I-doped nanowire (also referred to as the I-region of the nanowire), and finally growing a p-doped nanowire. The doping of the nanowire is carried out be methods well known in the art. In FIGS. 4 and 5, the gold on the nanowire could be shaped as a bead, a half-bead or a substantially flat layer.

The step of depositing a conformal dielectric coating shown in FIG. 3-13 of Example 1 is omitted.

Finally, the steps shown in FIGS. 3-14 to 3-19 are carried out.

Figures 3, 4, 5, 6:
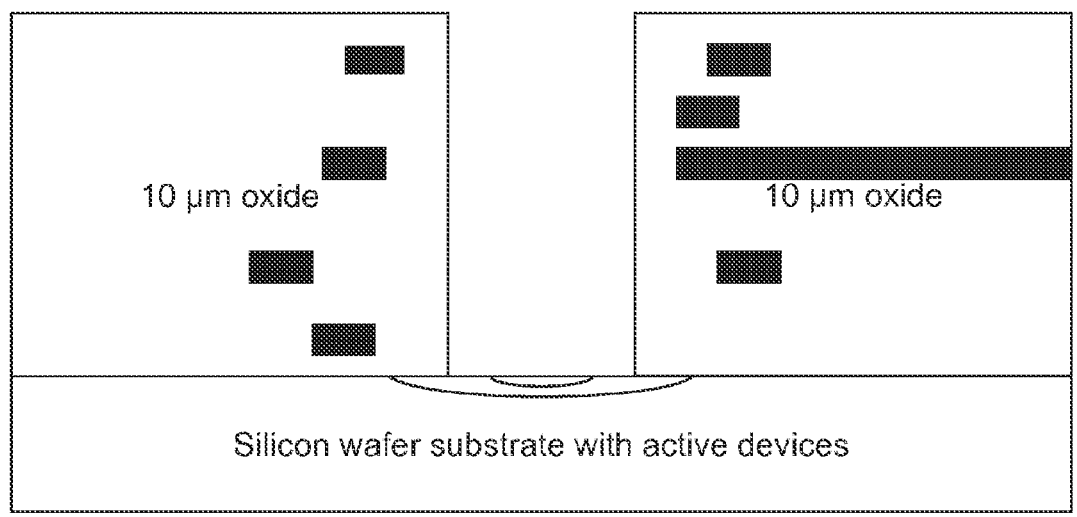

In other embodiments, the could be multiple nanowires in a single deep cavity as shown in FIG. 6 wherein at the bottom is a silicon substrate on which there is an array of nanowires over which is a coupler (shown as an oval), and over the coupler is a region (shown as rectangular box) through which light comes in to the coupler.

The recognition of color and luminance by the embodiments of the image sensors could be done by color reconstruction. Each compound pixel has complete luminance information obtained by combining its two complementary outputs. As a result, the same image sensor can be used either as a full resolution black and white or full color sensor.

The color reconstruction could be done to obtain full color information by the appropriate combination of two adjacent pixels, which could be one embodiment of a compound pixel, either horizontally or vertically. The support over which color information is obtained is less than the dimension of two pixels as opposed to 4 for the Bayer pattern.

Figures 3, 4, 5, 6, 7:
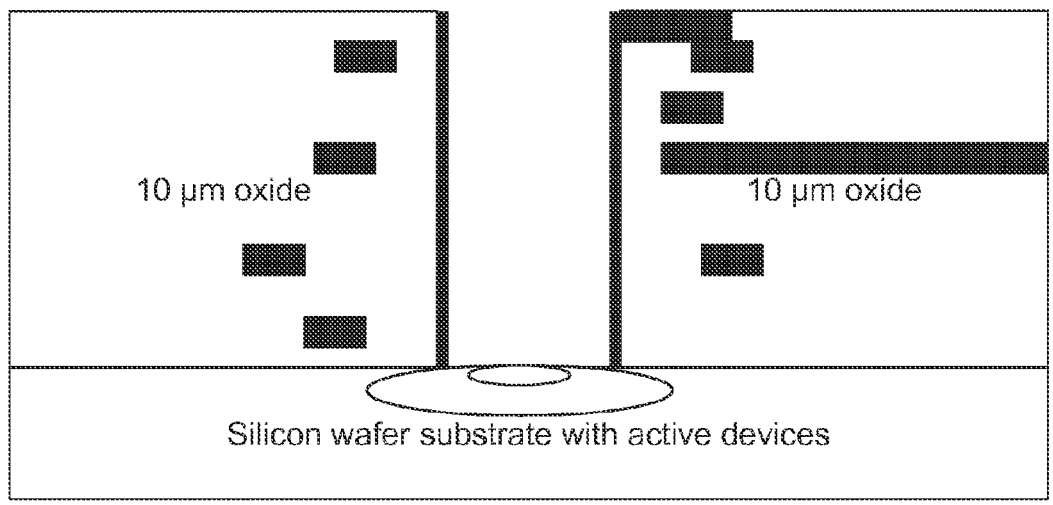
Figures 3, 4, 5, 6, 7, 8:
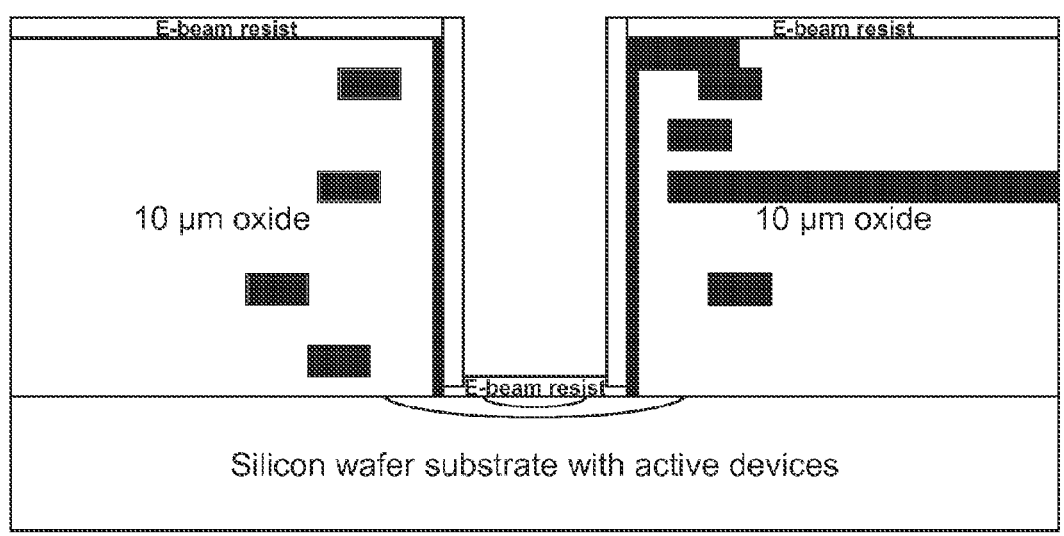
Figures 3, 4, 5, 6, 7, 8, 9:
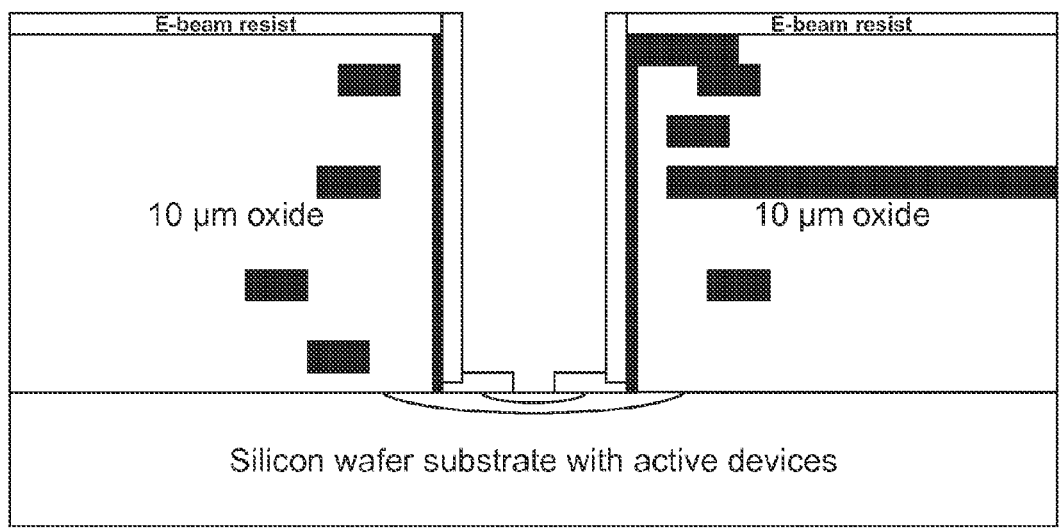
Figures 3, 4, 5, 6, 7, 8, 9, 10:
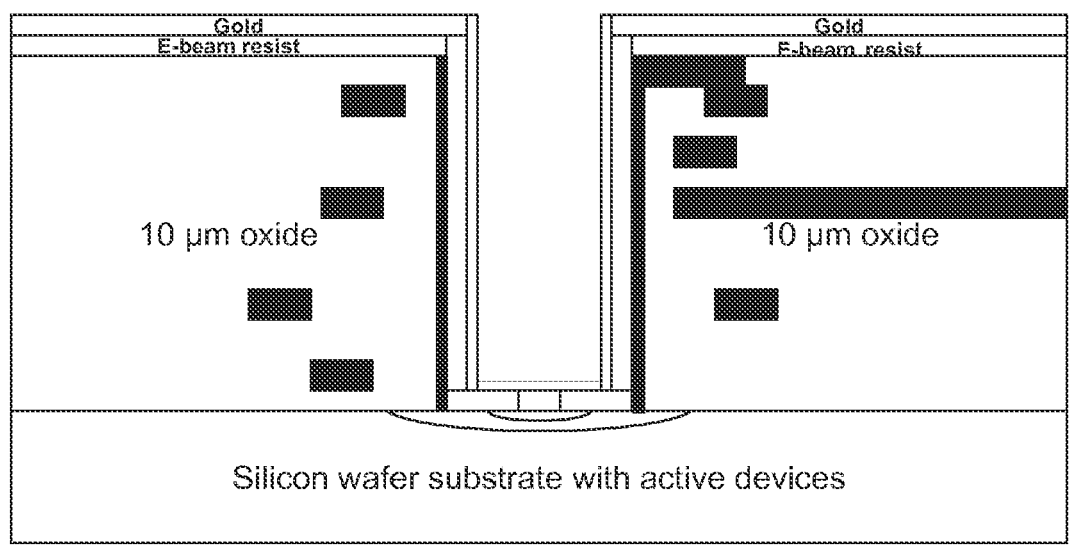
Figures 3, 4, 5, 6, 7, 8, 9, 10, 11:
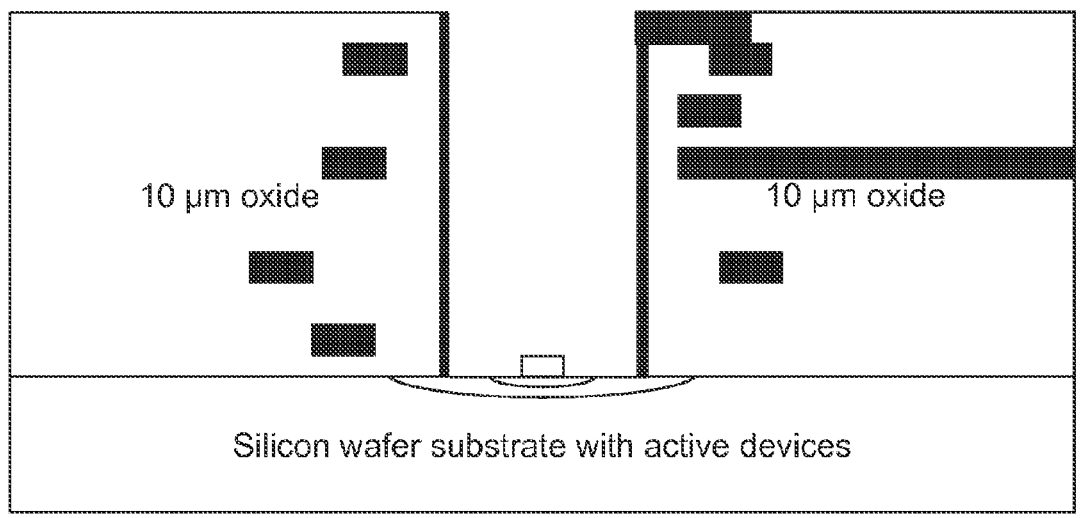
Figures 3, 4, 5, 6, 7, 8, 9, 10, 11, 12:
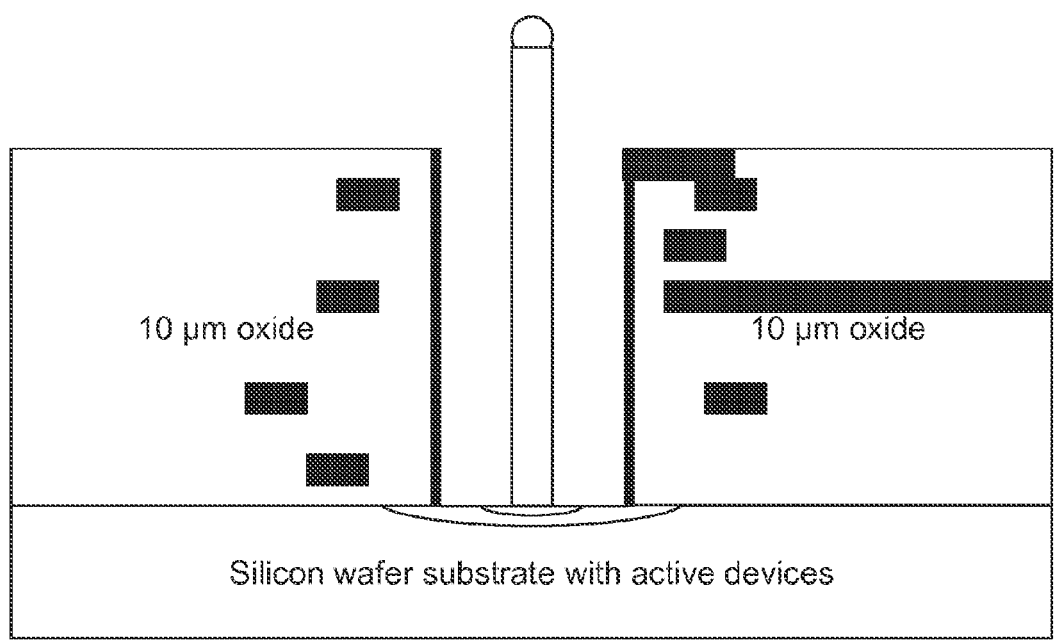
Figures 3, 4, 5, 6, 7, 8, 9, 10, 11, 12, 13:
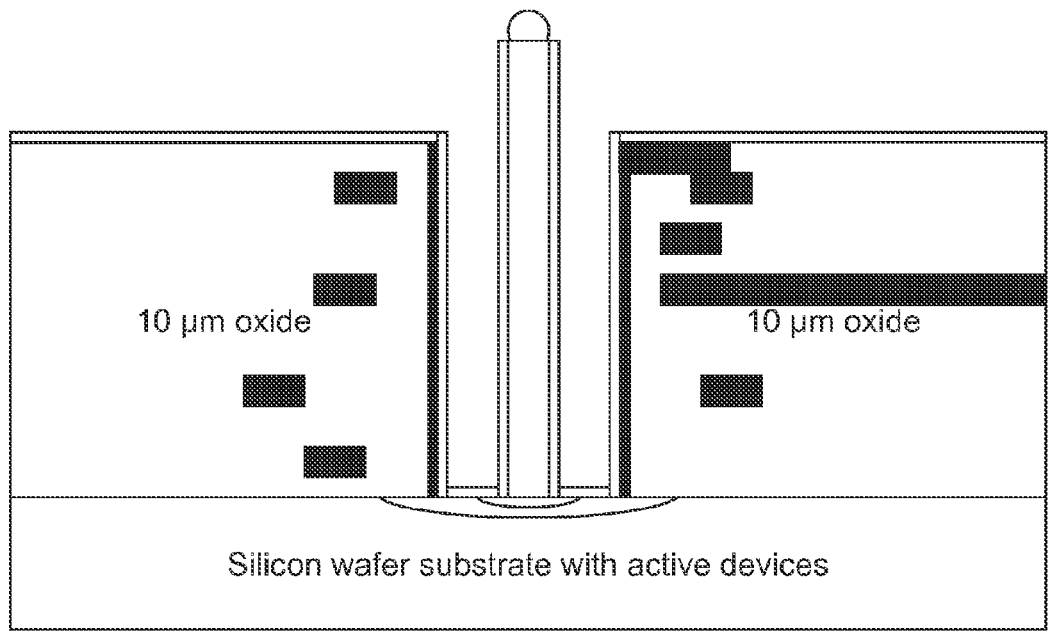
Figures 3, 4, 5, 6, 7, 8, 9, 10, 11, 12, 13, 14:
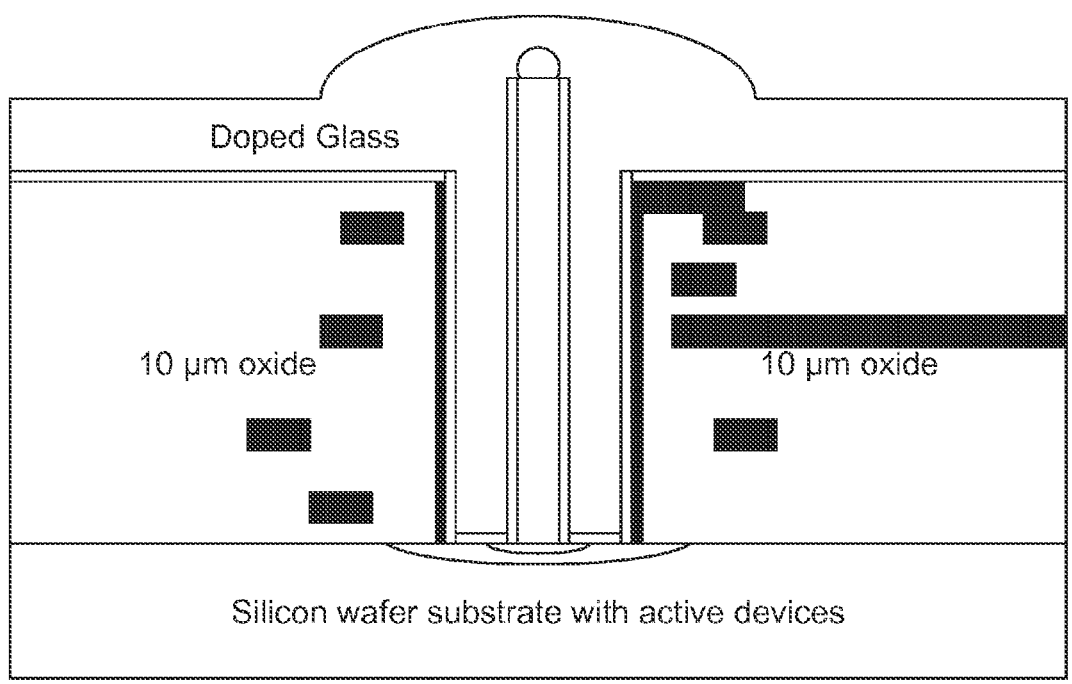
Figures 3, 4, 5, 6, 7, 8, 9, 10, 11, 12, 13, 14, 15:
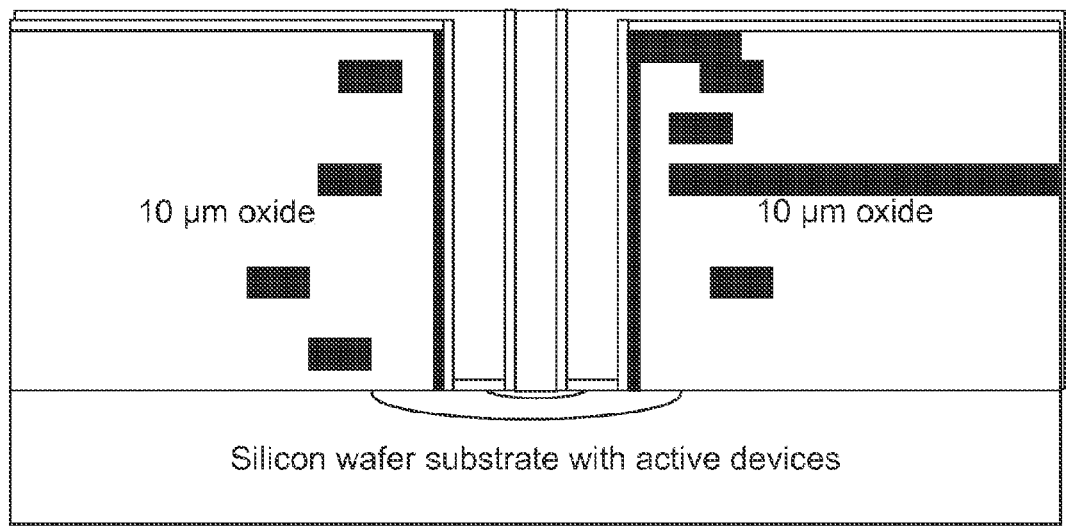
Figures 3, 4, 5, 6, 7, 8, 9, 10, 11, 12, 13, 14, 15, 16:
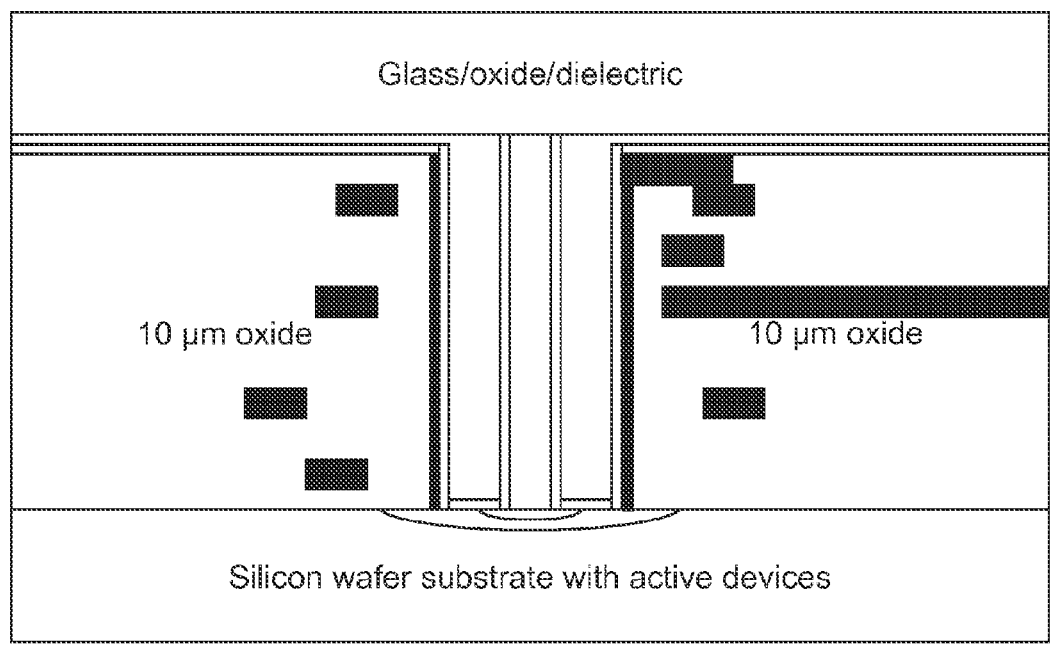
Figures 3, 4, 5, 6, 7, 8, 9, 10, 11, 12, 13, 14, 15, 16, 17:
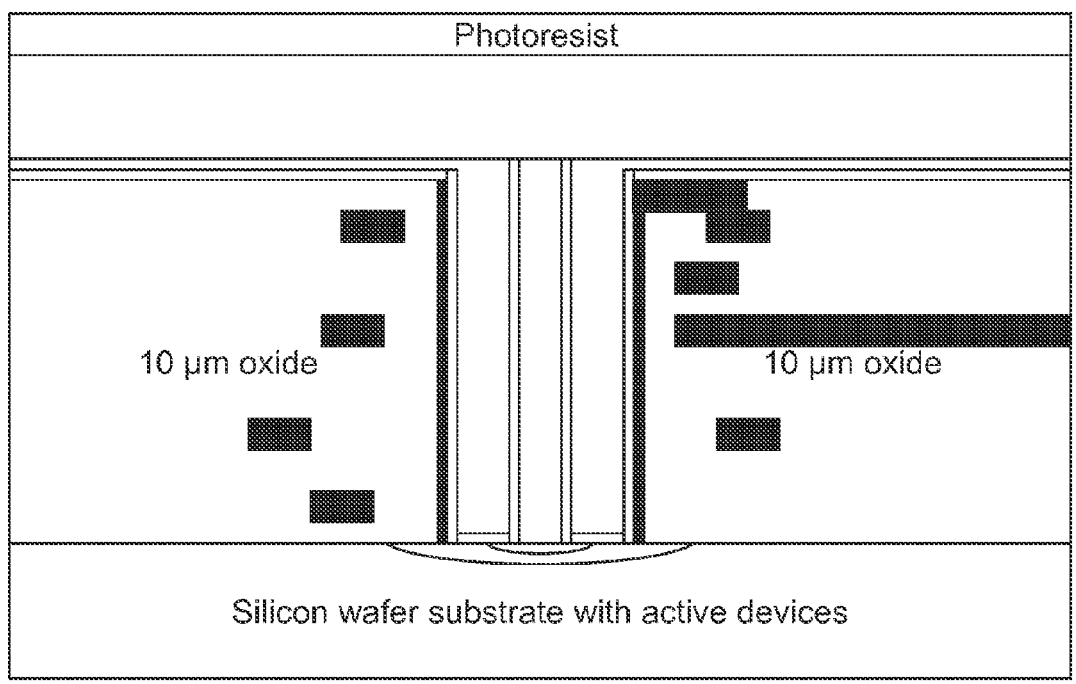
Figures 3, 4, 5, 6, 7, 8, 9, 10, 11, 12, 13, 14, 15, 16, 17, 18:
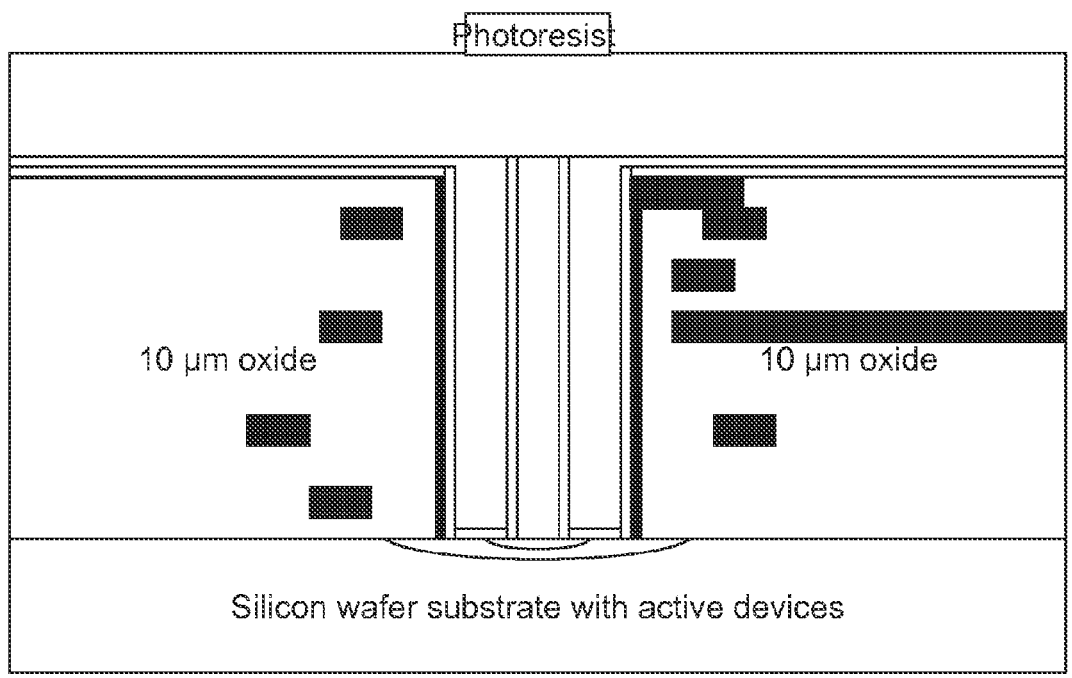
Figures 3, 4, 5, 6, 7, 8, 9, 10, 11, 12, 13, 14, 15, 16, 17, 18, 19:
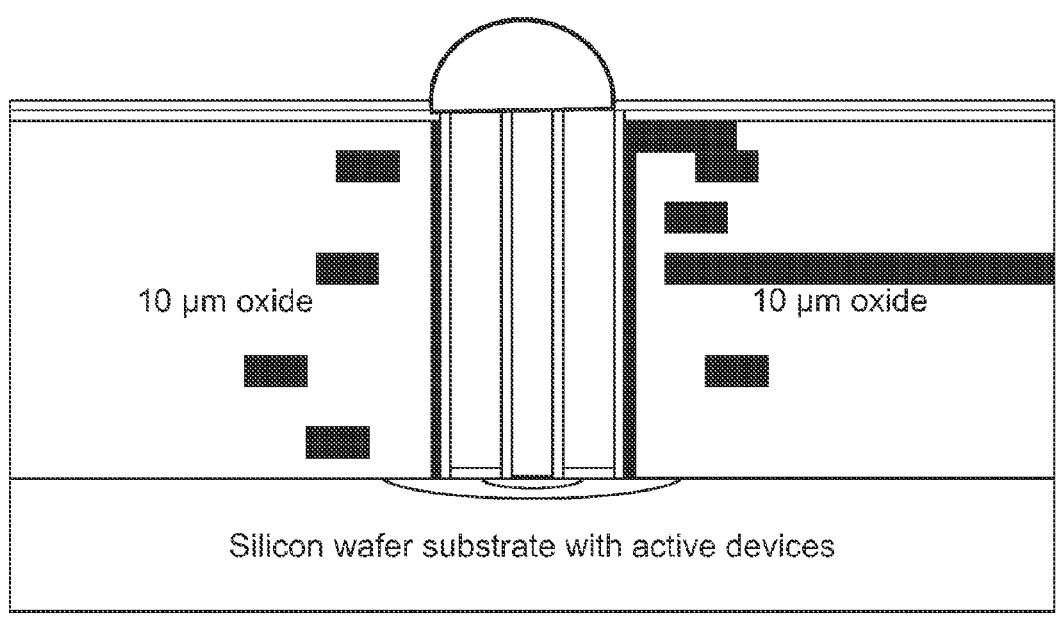
Figure 4:
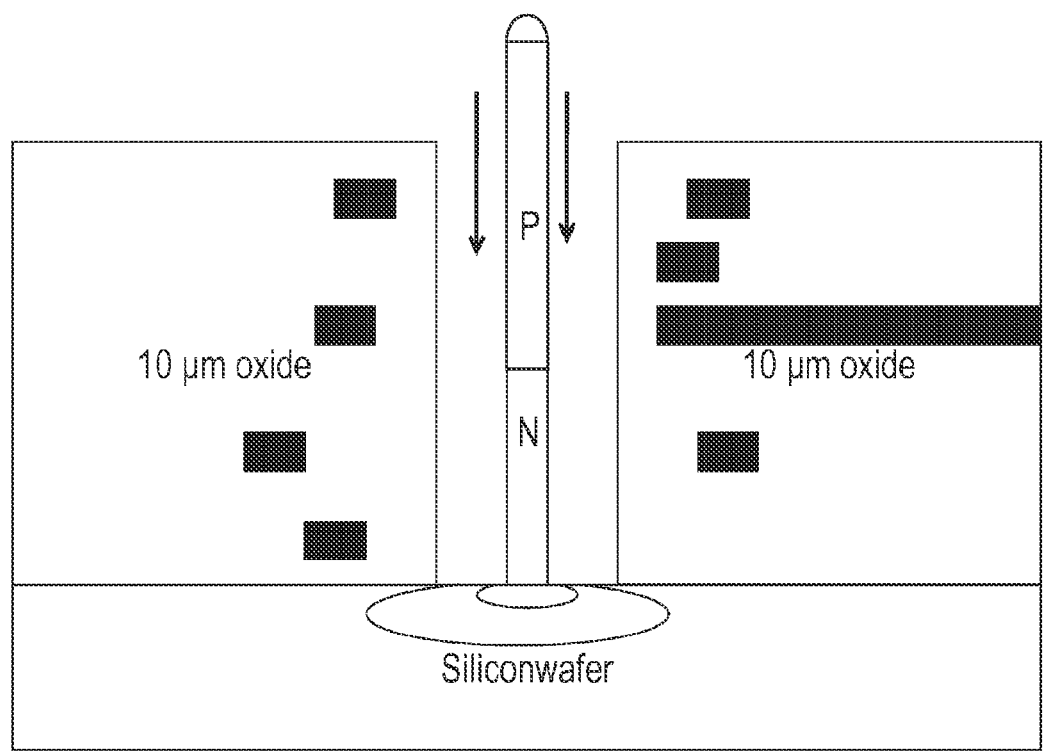
Figure 5:
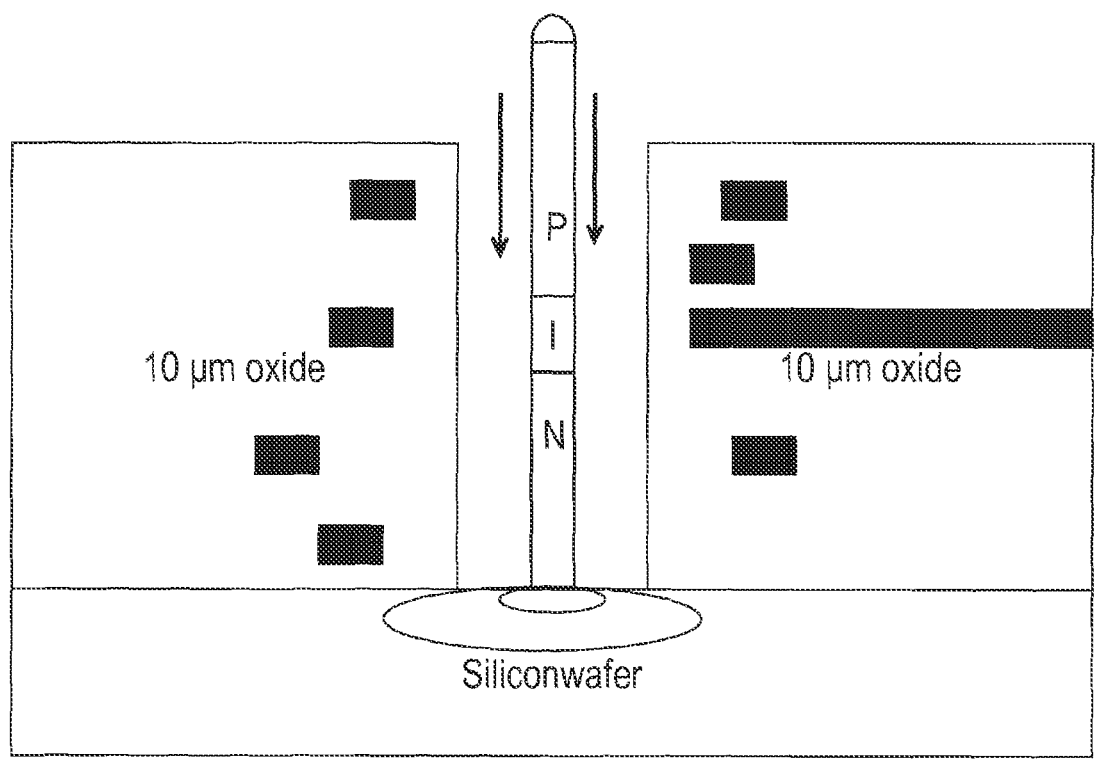
Figure 6:
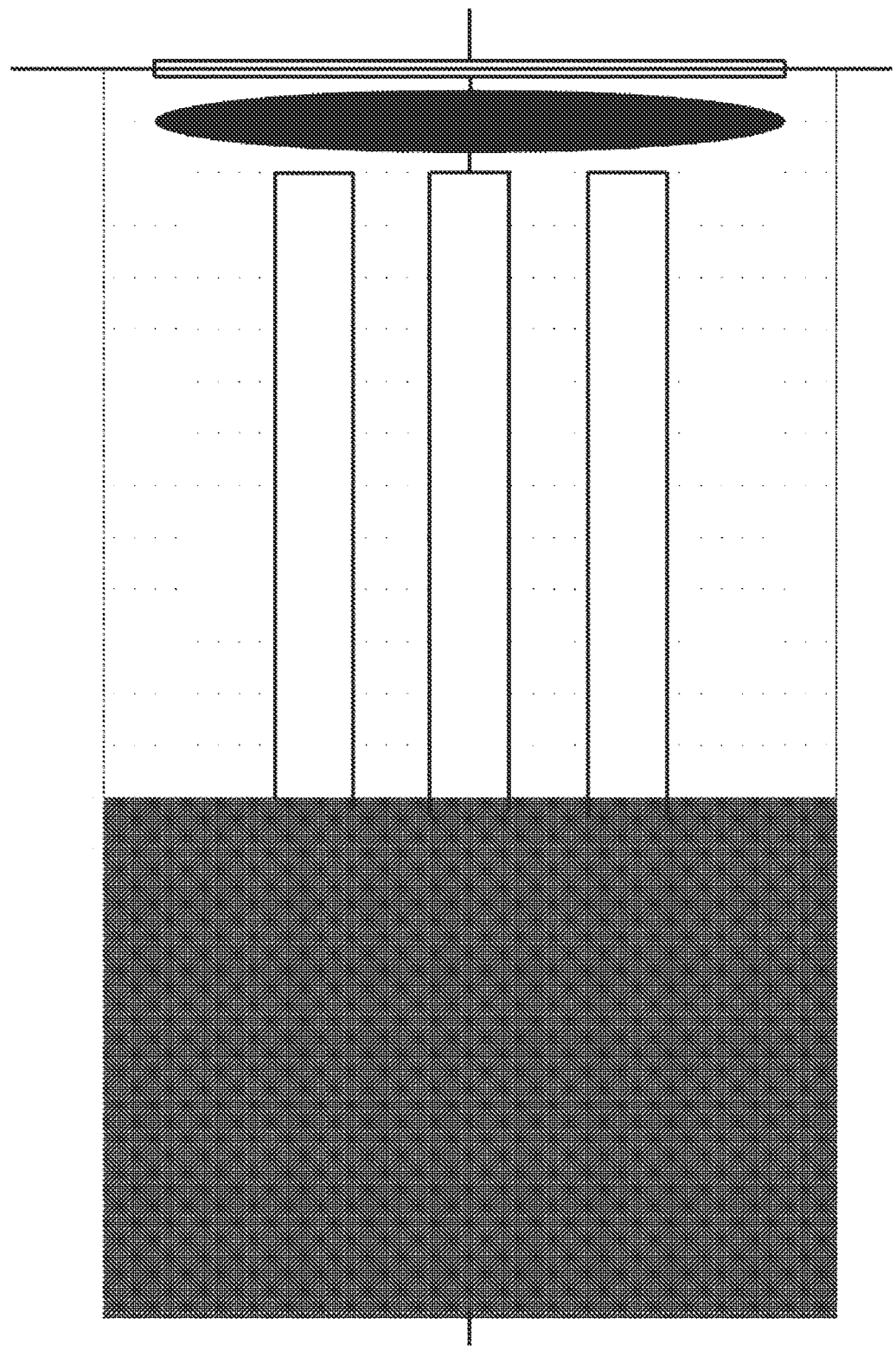
Figure 7:
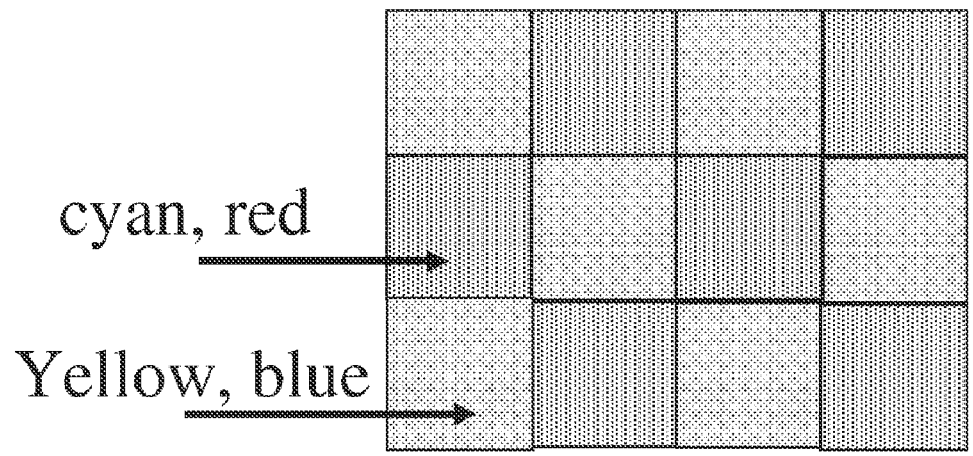

Each physical pixel of a device containing an image sensor of the embodiments disclosed herein would have two outputs representing the complementary colors, e.g., cyan, red (C, R) designated as output type 1 or yellow, blue (Y, B) designated as output type 2 as shown in FIG. 7. These four outputs of two pixels of a compound pixel can be resolved to reconstruct a full color scene of an image viewed by a device containing the image sensors of the embodiments described herein.

The foregoing detailed description has set forth various embodiments of the devices and/or processes via the use of diagrams, flowcharts, and/or examples. Insofar as such diagrams, flowcharts, and/or examples contain one or more functions and/or operations, it will be understood by those within the art that each function and/or operation within such diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to optical coupling to permit transmission of optical light, for example via an optical pipe or fiber, physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

All references, including but not limited to patents, patent applications, and non-patent literature are hereby incorporated by reference herein in their entirety.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

We claim:

1. An device comprising an optical pipe comprising a core and a cladding, the optical pipe being configured to separate wavelengths of an electromagnetic radiation beam incident on the optical pipe at a selective wavelength through the core and the cladding, wherein the core is configured to be both a channel to transmit the wavelengths up to the selective wavelength and an active element to detect the wavelengths up to the selective wavelength transmitted through the core; wherein the selective wavelength is an infrared wavelength.

2. The device of claim 1, wherein the core comprises a waveguide.

3. The device of claim 1, wherein the active element is configured to be a photodiode, a charge storage capacitor, or combinations thereof.

4. The device of claim 3, wherein the device is an image sensor.

5. The device of claim 1, wherein the core comprises a waveguide comprising a semiconductor material.

6. The device of claim 5, further comprising a passivation layer around the waveguide.

7. The device of claim 5, further comprising a metal layer around the waveguide.

8. The device of claim 6, further comprising a metal layer around the passivation layer.

9. The device of claim 1, wherein the device comprises no color or IR filter.

10. The device of claim 1, wherein the optical pipe is circular, non-circular or conical.

11. The device of claim 1, wherein the core has a core index of refraction ($n_1$), and the cladding has a cladding index of refraction ($n_2$), wherein $n_1 > n_2$, $n_1 = n_2$, or $n_1 < n_2$.

12. The device of claim 2, wherein the selective wavelength is a function of the diameter of the waveguide.

13. The device of claim 2, further comprising at least a pair of metal contacts with at least one of the metal contacts being contacted to the waveguide.

14. The device of claim 1, wherein the optical pipe is configured to separate wavelengths of an electromagnetic radiation beam incident on the optical pipe at a selective wavelength through the core and the cladding without a color or IR filter.

15. The device of claim 5, wherein the waveguide is configured to convert energy of the electromagnetic radiation transmitted through the waveguide and to generate electron hole pairs (excitons).

16. The device of claim 15, wherein the waveguide comprises a PIN junction that is configured to detect the excitons generated in the waveguide.

17. The device of claim 15, further comprising an insulator layer around the waveguide and a metal layer around the insulator layer to form a capacitor that is configured to collect the excitons generated in the waveguide and store charge in the capacitor.

18. The device of claim 17, further comprising metal contacts that connect to the metal layer and waveguide to control and detect the charge stored in the capacitor.

19. The device of claim 1, wherein the cladding is configured to be a channel to transmit the wavelengths of the electromagnetic radiation beam that do not transmit through the core.

20. The device of claim 1, wherein the cladding comprises a passive waveguide.

21. The device of claim 19, further comprising a peripheral photosensitive element, wherein the peripheral photosensitive element is operably coupled to the cladding.

22. The device of claim 1, wherein an electromagnetic radiation beam receiving end of the optical pipe comprises a curved surface.

23. The device of claim 21, wherein the peripheral photosensitive element is located on or within a substrate.

24. The device of claim 1, wherein the core and the cladding are located on a substrate comprising an electronic circuit.

25. The device of claim 1, further comprising a lens structure or an optical coupler over the optical pipe, wherein the lens structure or the optical coupler is operably coupled to the optical pipe.

26. The device of claim 25, wherein the lens structure or the optical coupler comprises a curved surface to channel the electromagnetic radiation into the optical pipe.

27. The device of claim 1, further comprising a color or IR filter.

28. The device of claim 1, further comprising a stack surrounding the optical pipe, the stack comprising metallic layers embedded in dielectric layers, wherein the dielectric layers have a lower refractive index than that of the cladding.

29. The device of claim 28, wherein a surface of the stack comprises a reflective surface.

30. The device of claim 1, wherein the core comprises a first waveguide and the cladding comprises a second waveguide.

31. A compound light detector comprising at least two different devices, each device comprising an optical pipe comprising a core and a cladding, the optical pipe being configured to separate wavelengths of an electromagnetic radiation beam incident on the optical pipe at a selective wavelength through the core and the cladding, wherein the core is configured to be both a channel to transmit the wavelengths up to the selective wavelength and an active element to detect the wavelengths up to the selective wavelength transmitted through the core, and the compound light detector is configured to reconstruct a spectrum of wavelengths of the electromagnetic radiation beam; wherein the selective wavelength is an infrared wavelength.

32. The compound light detector of claim 31, wherein the core comprises a first waveguide having the selective wavelength such that electromagnetic radiation of wavelengths beyond the selective wavelength transmits through the cladding, further wherein the selective wavelength of the core of each of the at least two different devices is different such that the at least two different devices separate the electromagnetic radiation beam incident on the compound light detector at different selective wavelengths.

33. The compound light detector of claim 32, wherein the cladding comprises a second waveguide that permits electromagnetic radiation of wavelengths beyond the selective wavelength to remains within the cladding and be transmitted to a peripheral photosensitive element.

34. The compound light detector of claim 33, wherein a cross-sectional area of the cladding at an electromagnetic radiation beam emitting end of the cladding is substantially equal to an area of the peripheral photosensitive element.

35. The compound light detector of claim 31, further comprising a stack of metallic and non-metallic layers surrounding the optical pipe of each of the at least two different optical sensors.

36. A compound light detector comprising at least a first device and a second device, wherein the first device is configured to provide a first separation of an electromagnetic radiation beam incident on the optical pipe at a first selective wavelength without any filter, the second device is configured to provide a second separation of the electromagnetic radiation beam incident on the optical pipe at a second selective wavelength without any filter, the first selective wavelength is different from the second selective wavelength, each of the first device and the second device comprises a core that is configured to be both a channel to transmit the wavelengths up to the selective wavelength and an active element to detect the wavelengths up to the selective wavelength transmitted through the core, and the compound light detector is configured to reconstruct a spectrum of wavelengths of the electromagnetic radiation beam; wherein at least one of the first and second selective wavelengths is an infrared wavelength.

37. The compound light detector of claim 36, wherein the first device comprises a first waveguide having the first selective wavelength such that electromagnetic radiation of wavelength beyond the first selective wavelength will not be confined by the first waveguide, wherein the second device comprises a second waveguide having the second selective wavelength such that electromagnetic radiation of wavelength beyond the second selective wavelength will not be confined by the second waveguide, further wherein the first selective wavelength is different from the second selective wavelength.

38. The device of claim 37, wherein the first device further comprises a first waveguide that permits electromagnetic radiation of wavelength of greater than the first selective wavelength to remains within the first waveguide and the second device further comprises a second waveguide that permits electromagnetic radiation of wavelength of greater than the second selective wavelength to remains within the second waveguide.

39. The compound light detector of claim 36, wherein each of the first and second devices comprises a cladding comprising a photosensitive element.

40. The compound light detector of claim 39, further comprising a stack of metallic and non-metallic layers surrounding the first and second devices.

41. The compound light detector of claim 36, wherein the first device comprises a core of a different diameter than that of the second device and the spectrum of wavelengths comprises wavelengths of visible light.

42. The compound light detector of claim 31, wherein a plurality of light detectors are arranged on a square lattice, an hexagonal lattice, or in a different lattice arrangement.

43. The device of claim 25, wherein the lens structure or the optical coupler comprises a first opening and a second opening with the first opening being larger than the second opening, and a connecting surface extending between the first and second openings.

44. The device of claim 43, wherein the connecting surface comprises a reflective surface.

45. The compound light detector of claim 31, wherein the two different devices comprise cores of different diameters.

46. The compound light detector of claim 31, wherein the spectrum of wavelengths comprises wavelengths of visible light, IR or combinations thereof.

47. The compound light detector of claim 36, wherein the first device comprises a core of a different diameter than that of the second device and the spectrum of wavelengths comprises wavelengths of visible light, IR or combinations thereof.

48. The compound light detector of claim 31, wherein a plurality of light detectors are arranged on a regular tessellation.

49. The compound light detector of claim 36, wherein a plurality of light detectors are arranged on a regular tessellation.

50. The device of claim 1, wherein the device is configured to resolve black and white or luminescence information contained in the electromagnetic radiation by appropriate combinations of energies of the electromagnetic radiation detected in the core and the cladding.

51. The compound light detector of claim 31, wherein the compound light detector is configured to detect energies of the electromagnetic radiation of four different ranges of wavelengths.

52. The light detector of claim 51, wherein the energies of the electromagnetic radiation of the four different ranges of wavelengths are combined to construct red, green and blue colors.

53. The compound light detector of claim 36, wherein the compound light detector is configured to detect energies of the electromagnetic radiation of four different ranges of wavelengths.

54. The light detector of claim 53, wherein the energies of the electromagnetic radiation of the four different ranges of wavelengths are combined to construct red, green and blue colors.

* * * * *